United States Patent
Lackey et al.

(10) Patent No.: US 8,702,455 B1
(45) Date of Patent: Apr. 22, 2014

(54) CONNECTOR ASSEMBLIES AND BLADE CONTACT STRUCTURES THEREFOR

(75) Inventors: Brandon L. Lackey, Lebanon, MO (US); Mark K. Shoemaker, Lebanon, MO (US)

(73) Assignee: The Durham Company, Lebanon, MO (US)

( * ) Notice: Subject to any disclaimer, the term of this patent is extended or adjusted under 35 U.S.C. 154(b) by 63 days.

(21) Appl. No.: 13/482,143

(22) Filed: May 29, 2012

Related U.S. Application Data

(63) Continuation-in-part of application No. 13/021,005, filed on Feb. 4, 2011, now Pat. No. 8,218,295.

(60) Provisional application No. 61/303,298, filed on Feb. 10, 2010.

(51) Int. Cl.
*H01R 13/15* (2006.01)

(52) U.S. Cl.
USPC .......................................... 439/839

(58) Field of Classification Search
USPC ............................ 439/839, 830, 833; 361/670
See application file for complete search history.

(56) References Cited

U.S. PATENT DOCUMENTS

| | | | |
|---|---|---|---|
| 1,938,097 A * | 12/1933 | Curlee | 337/195 |
| 2,952,005 A * | 9/1960 | Detch | 439/833 |
| 3,131,984 A | 5/1964 | Kobryner | |
| 3,221,216 A | 11/1965 | Kobryner | |
| 3,289,150 A | 11/1966 | Sturdivan | |
| 3,335,399 A * | 8/1967 | Rys | 439/739 |
| 3,375,409 A * | 3/1968 | Sturdivan | 361/670 |
| 3,880,494 A * | 4/1975 | Reed et al. | 439/517 |
| 4,037,917 A * | 7/1977 | Clement | 439/831 |
| 4,040,713 A * | 8/1977 | Konnemann | 439/839 |
| 4,201,439 A | 5/1980 | M'Sadoques | |
| 4,500,162 A * | 2/1985 | Keglewitsch et al. | 439/830 |
| 4,505,530 A | 3/1985 | Fennel | |
| 4,640,571 A | 2/1987 | Walter et al. | |
| 4,950,195 A * | 8/1990 | Perreault et al. | 439/830 |
| 5,118,314 A * | 6/1992 | Mangone et al. | 439/830 |
| 6,722,926 B2 * | 4/2004 | Chevassus-More | 439/721 |
| 7,291,042 B2 | 11/2007 | Johnson | |
| 7,503,800 B2 | 3/2009 | Siglock et al. | |
| 7,614,908 B2 | 11/2009 | Zhang | |
| 7,766,706 B2 * | 8/2010 | Kawamura et al. | 439/839 |
| 7,785,137 B2 | 8/2010 | Porter et al. | |
| 2009/0104014 A1 * | 4/2009 | Satou et al. | 414/806 |

* cited by examiner

*Primary Examiner* — Gary Paumen
(74) *Attorney, Agent, or Firm* — Richard L. Marsh

(57) ABSTRACT

A connector assembly comprises a base, a conventional lay in conductor connector channel, a blade contact superstructure and a blade contact. The base has the blade contact superstructure appended to one sidewall thereof. The blade contact superstructure has a cavity between generally "V" shaped blade receiving supports. The blade contact is a plated copper strip and is inserted into the cavity between the blade receiving supports where the blade contact then becomes an interface between the superstructure and an electrical blade inserted in the blade contact.

16 Claims, 18 Drawing Sheets

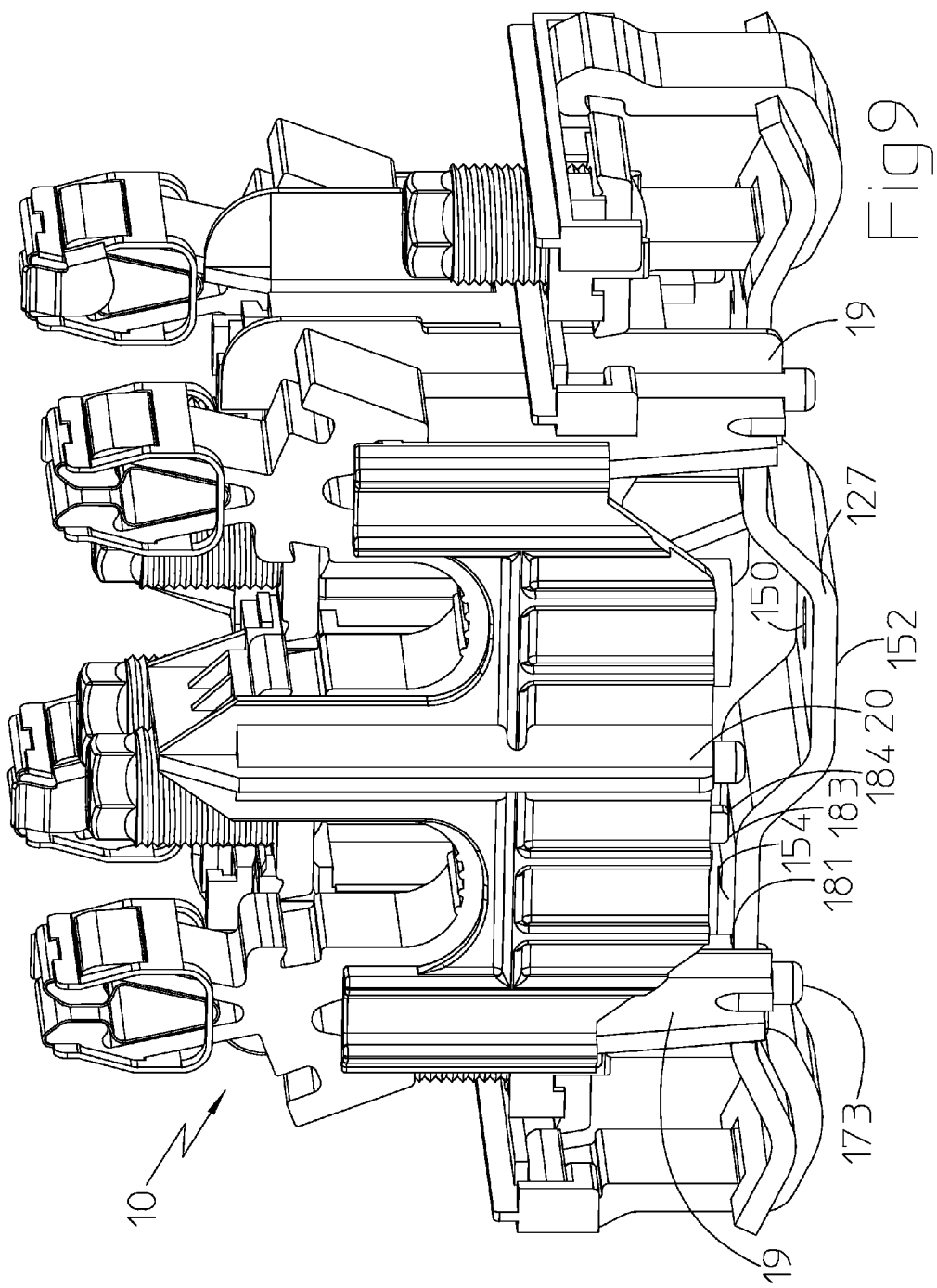

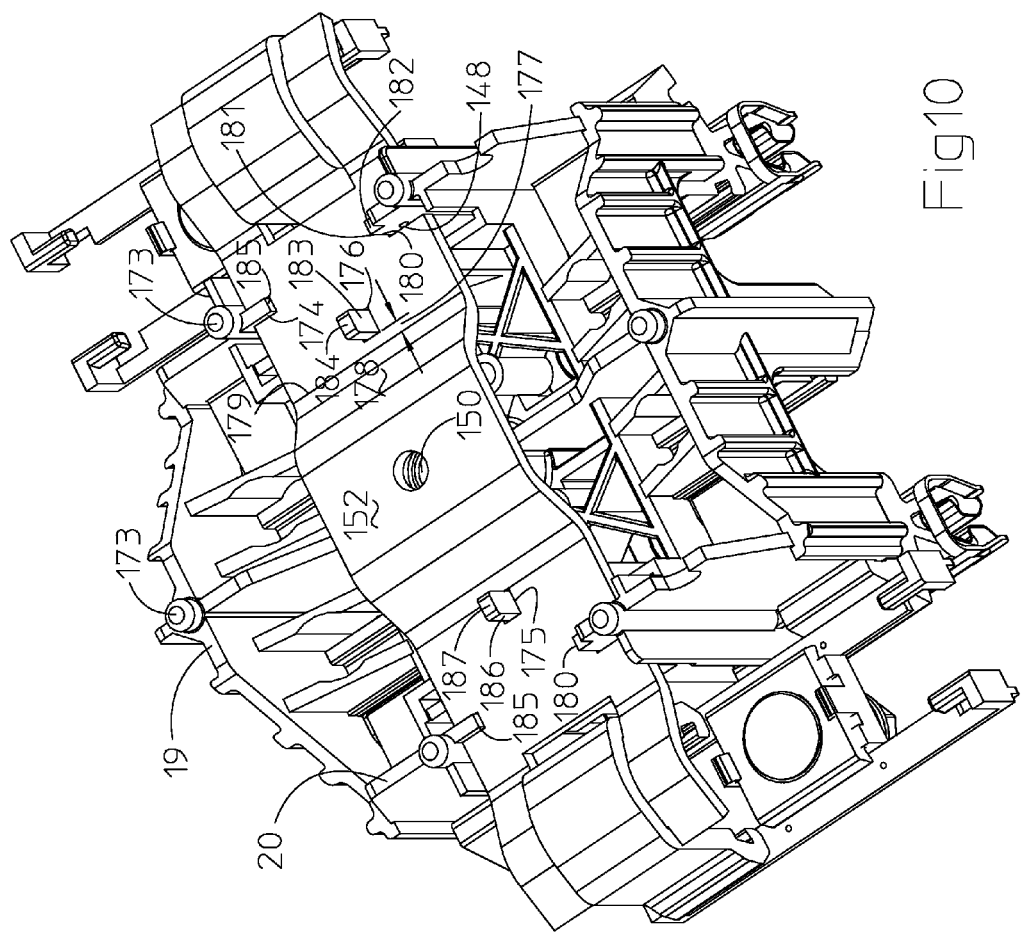

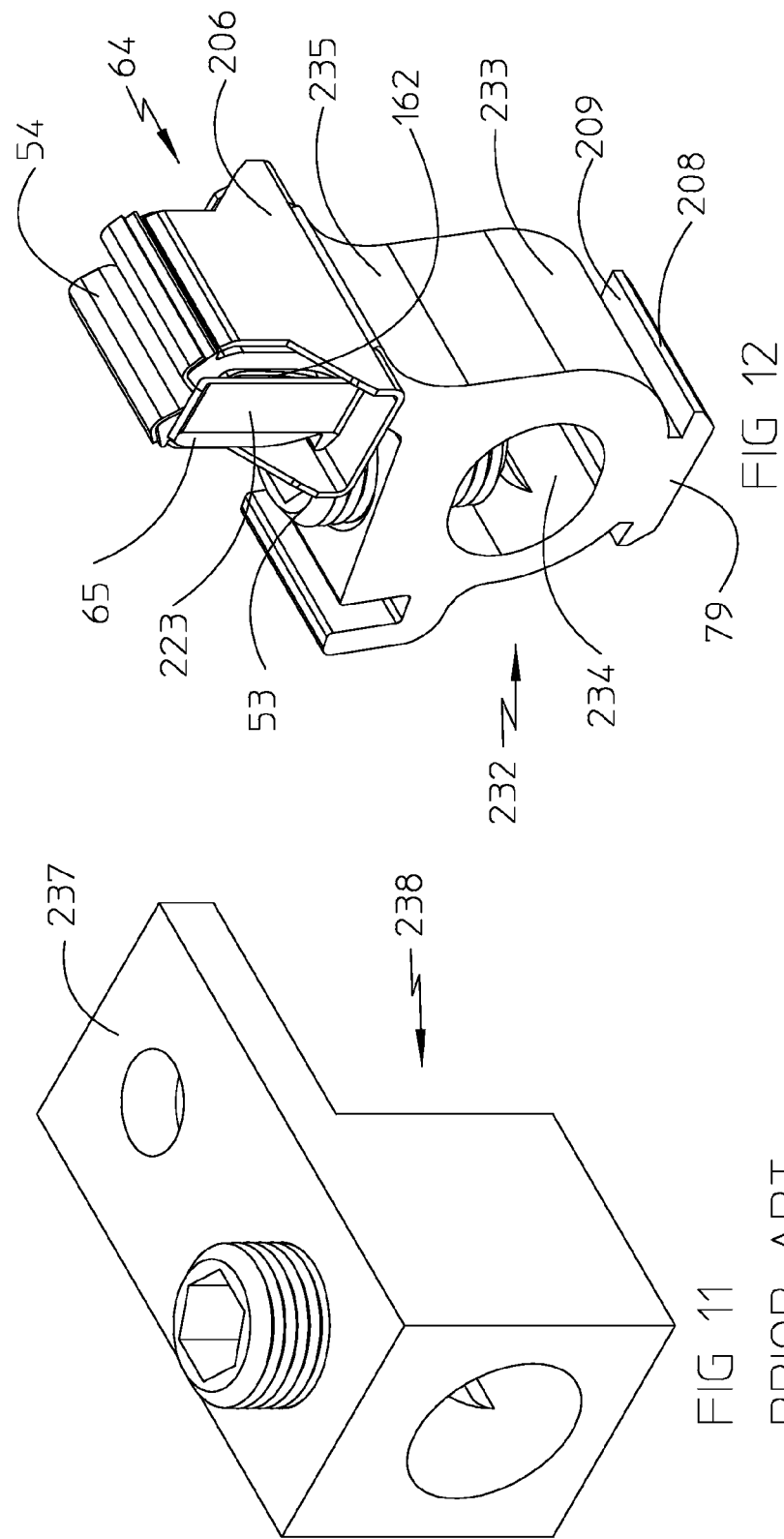

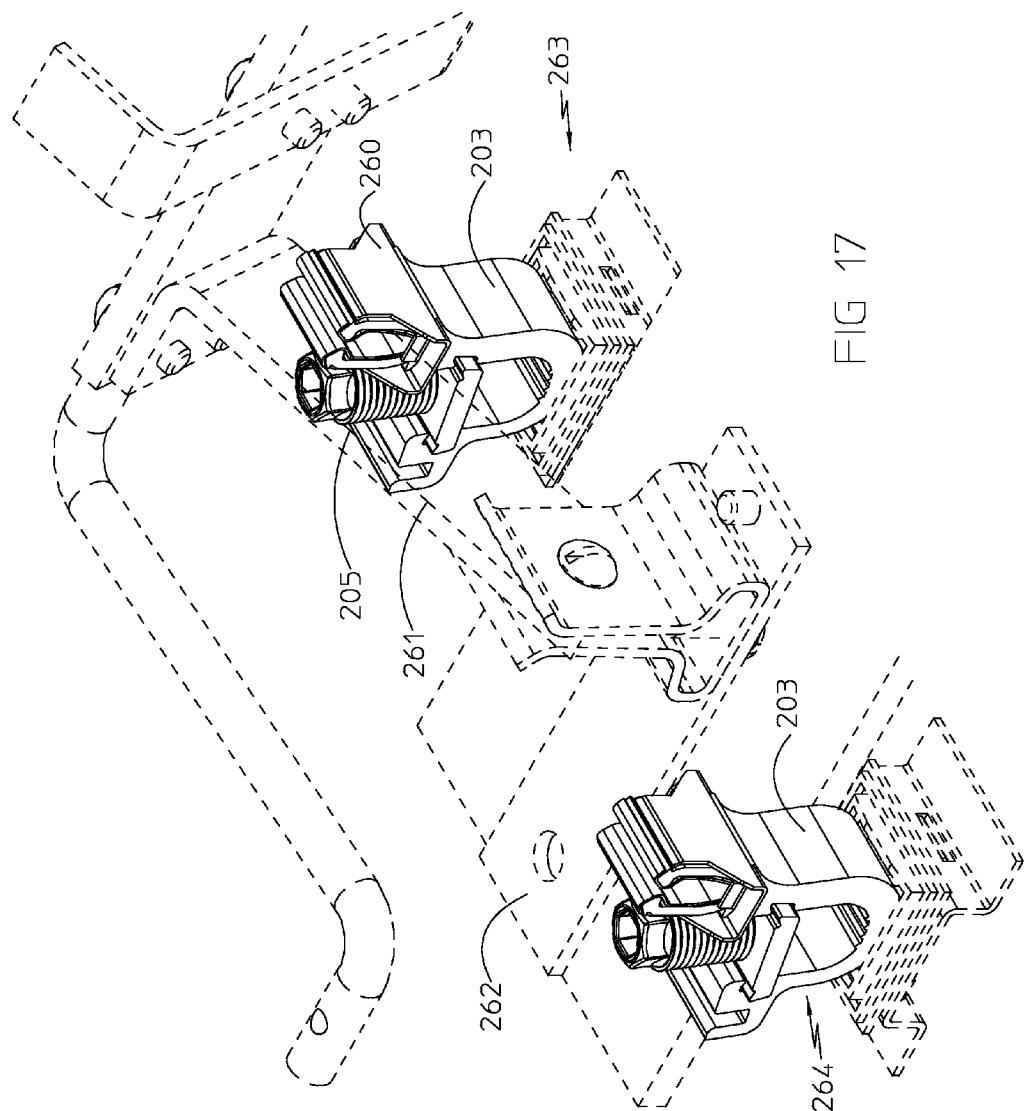

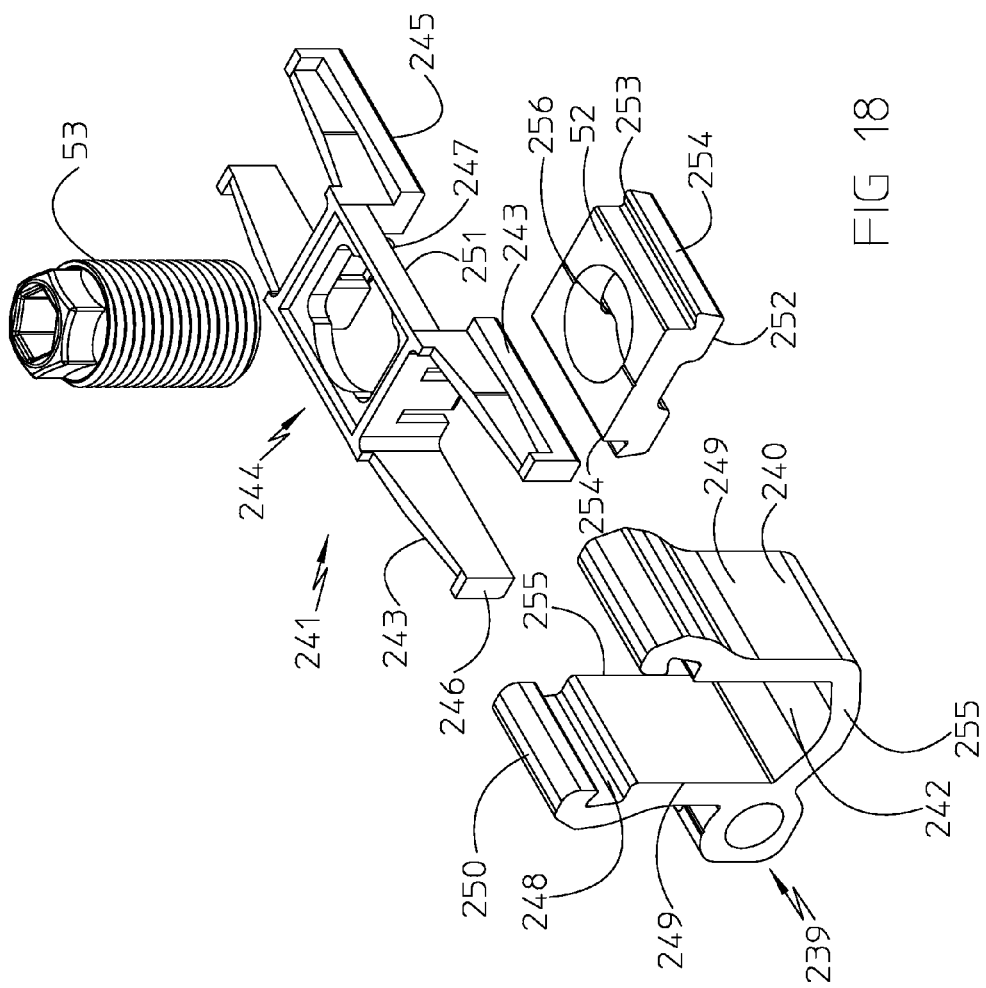

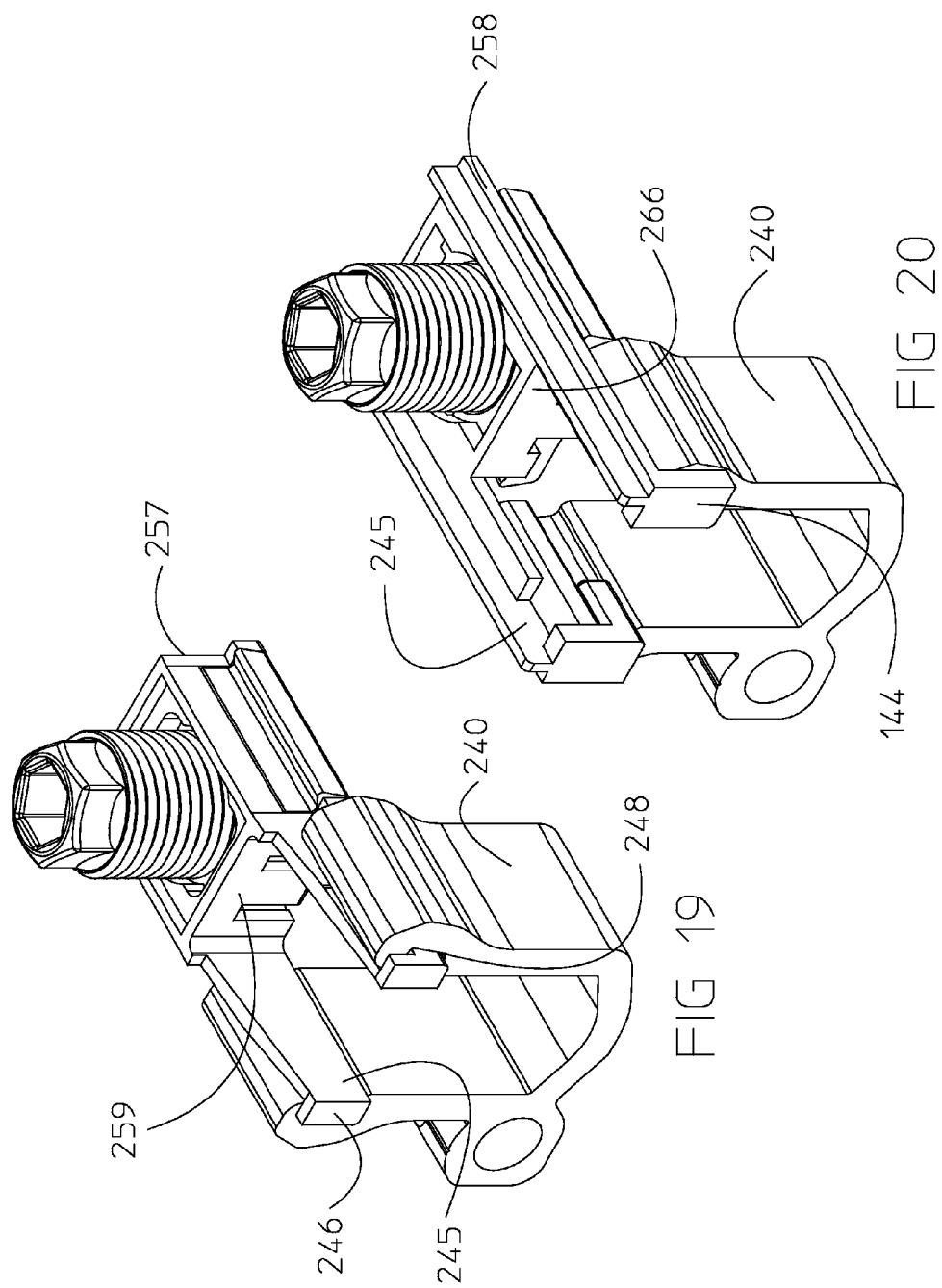

CONNECTOR ASSEMBLIES AND BLADE CONTACT STRUCTURES THEREFOR

REFERENCE TO RELATED APPLICATIONS

This application is a continuation-in part application of Applicants' application Ser. No. 13/021,005, filed 4 Feb. 2011, now allowed which is a non-provisional application of Applicants' provisional application Ser. No. 61/303,298 filed 10 Feb. 2010, the entirety thereof incorporated herein by this reference thereto.

BACKGROUND OF THE INVENTION

1. Field of the Invention

This invention relates to an electrical meter socket block, unitary lugs incorporating sliding lug caps and an enclosure therefor such provision is made to seal a watt-hour meter with either a ring style cover and sealing ring or with a ring less cover by reversing the orientation of the meter socket block. The invention also relates to electrical connector assemblies and blade contact structures therefor which may also include a removably retained connector cap and slidable cap carrier.

2. Prior Art Statement

It is known to provide a conventional connector channel having a horizontal tab extending from a sidewall of a base, the tab provided with a through hole and a plurality of radial slots around the through hole. A stud is adapted to be inserted through the through hole of the tab, through a base of a blade receiver, through a spring and threaded into a blade stop. The stud also is adapted to be inserted into a hole in an insulator and affixed thereto with a nut threaded upon the free end of the stud and tightened against the insulator base. A conductor cap is adapted to be inserted into slots in the upper ends of the sidewalls of the base whereupon a conductor securing screw is inserted into the threaded hole in the conductor cap for tightening against a conductor laid in the lay in channel. As is readily noted, four parts are required to provide and secure a blade receiver on the tab. Conventional conductor connector with the tab may be used in disconnects, meter enclosures, electrical panels and the like. For instance, see FIG. 13. In some installations, the conventional blade receiver is typically constructed of plated aluminum while the blade inserted into the blade receiver is typically a plated copper blade. Contact issues may arise from these dissimilar metals and therefore there is a need for a blade contact element that is of a material similar to that of the blade. Additionally, there is a need for a conventional conductor connector or conventional conductor lay-in connector for receiving an electrical blade that has fewer parts, is readily assembled and which provides an improved interface with the blade receiver. There is also a need for an improved reinforcing spring that is captured upon the blade receiver and provides a significant positive force on the uprights of the blade receiver.

Stab type electrical revenue meters are well known in the field. Revenue meter enclosures typically consist of two different methods of grounding and sealing the meter. The ring style is mounted in an enclosure having a raised lip on a front wall cover of the enclosure wherein the meter extends through a hole centrally disposed in the lip and is sealed and grounded at the ring. The ring less style also extends through a hole in a front wall cover of an enclosure wherein the hole in the front wall of the enclosure is smaller in diameter than the body of the meter below the viewing glass. In a ring less style enclosure, a meter is grounded inside the enclosure on tabs and sealed at the cover latches. The ring style requires the meter socket inside to be spaced away from the wall a greater distance than a ring less enclosure. Two separate formed sheet metal risers of different heights currently accomplish this, thus requiring the manufacturer to stock different size risers for the two commonly used sealing methods. Meter socket assemblies typically have removable connector caps to allow conductors to be laid into a lay-in channel rather than inserted into a port hole. The caps can easily be lost and often are dropped into the conduit at the base of the enclosure. Additionally, meter mounting assemblies comprise at least four jaw assemblies of multiple parts, multiple mounting blocks, at least one mounting bracket and various threaded fasteners for assembling the meter mounting assembly and mounting same to the enclosure. Conventional phase conductor connections of the prior art are generally disposed at a 45 degree angle with respect to the longitudinal axis of the enclosure and thus the generally larger and stiffer insulated phase conductors must be bent in order to connect either the load or line phase conductors to the meter mounts while the smaller neutral conductor, frequently uninsulated, is laid straight between the separated mounting blocks. Therefore, it is often difficult to make the connections as the phase conductors must be bent after inserting same through the conduit openings in a wall of the enclosure and is especially hard during cold weather. Accordingly, there is a need for a meter enclosure that has a meter block therein which allows the phase conductors to be laid straight from the conduit openings to lay in channels in the meter block with the smaller neutral conductors bent to lay in channels disposed alongside the meter socket block.

Thus, it is known to provide an enclosure that has a pair of laterally spaced integral risers embossed into a back wall of the enclosure for mounting a pair of meter jaw assemblies. The laterally spaced integral risers provide for use of jaw assemblies generally used for 100 ampere meters into a 200 ampere meter enclosure as the spacing of the 200 ampere conduit opening is from 0.75 to 0.875 inches higher than the conduit opening in 100 ampere meter enclosure. A recessed portion may be disposed between spaced apart raised portions. The offset nature of the lay in lug with respect to the line entrances requires bending of the very stiff power carrying load and line cables in an "S" curve in order to lay in while the frequently smaller diameter neutral conductor is laid straight between the two socket blocks. For instance, see the U.S. Patent Application 2008/0081510A1 published on 3 Apr. 2008 by Porter, et al., now U.S. Pat. No. 7,785,137 B2 issued on 31 Aug. 2001. No provision is made to mount meter jaw assemblies on different planes within the same enclosure, nor is it obvious from this patent application that such provision is even suggested. Therefore, there exists a great need for a meter socket and cooperating meter socket enclosure that allows sealing of either a ring type or ring less type meter installation in the enclosure by reversing the orientation of the meter socket block. There is also a need for a jaw assembly that cooperates with the meter socket block to capture all the lug caps of the lay-in jaw assembly upon the meter socket block. There is also a great need for a neutral conductor assembly that has a means for capturing the lug caps and holding same in a position adjacent an open neutral conductor channel while a neutral wire is inserted into a lay in channel of the neutral conductor assembly.

It is also known to mold jaw assemblies into separate meter socket blocks or to provide for a slide in jaw for each end of a meter socket block. For instance, see the U.S. Pat. No. 7,503,800 B2 issued on 17 Mar. 2009 to Siglock, et al. No provision is made to capture the lug cap on the mounting block nor is there a suggestion that the block is intended to retain the cap while a conductor is inserted into the jaw.

Furthermore, no support or reinforcement to the side edges of the extruded jaw is provided and thus the contact with the meter spades may be compromised. Generally, then there is weak contact between the extruded aluminum jaw parts and the metal of the meter blade. The phase conductor connections are disposed outwardly of the neutral connections thus subjecting the meter to potential by-pass tampering. Additionally, the phase conductors must still be bent sharply requiring use of a full length enclosure. Furthermore, the molded in or slide in tab provides substantially all the support for the conductor lay in channel, subjecting the channel to damage while installing and tightening the cap onto the channel. Thus, there is still a need for a jaw assembly that cooperates with the meter socket block to capture all the lug caps of the lay in jaw assembly upon the meter socket block and for a mounting block that is reversible upon bosses and recesses formed in a rear wall of a meter socket enclosure. There is a further need for a conductor lay in channel that is fully supported to reduce the likelihood of damage to either the channel walls or to the cap. Additionally, there is a great need for a meter mount of reduced height that provides greatly reduced labor in connecting as the meter mount has the phase conductor channels protected from tampering by centrally disposing the phase conductor channels inwardly relative to the spade connectors and beneath the center of the meter. Finally, there is a need for a jaw which receives a tin plated copper meter spade contact therein and receives a force enhancing spring cage installed over the upright legs of the jaw to provide reinforcement along the entire length of the jaw and provide a more positive location of the meter guide tab.

It is further known to provide for jaw portions of a meter receiving assembly that are pre-assembled to the insulating block with screws from the bottom of the support block into each jaw. Separate jaw assemblies are employed with both attached to a common support strap mounted onto and spaced away from a back wall of a meter enclosure. For instance, see U.S. Pat. Nos. 3,289,150 and 3,375,409 issued on 29 Nov. 1966 and 26 Mar. 1968, respectively to Rex E. Sturdivan. Each jaw is comprised of many parts and each jaw requires a screw to retain same upon the insulating block. Therefore, there is a great need to reduce the number of parts required for a meter mounting assembly comprised of at least four jaw/conductor lay in assemblies, a mounting block and conductor retaining caps. Additionally, there is need for a conductor connector that is provided with a blade contacting superstructure that receives a tin plated copper blade contact within the superstructure wherein the blade contact comprises an interface with an electrical blade and the superstructure. The superstructure may be provided with a spring for providing additional force contact between the plated blade contact and an electrical blade inserted therein. There still is a need for a meter mounting assembly that may be assembled and mounted to an enclosure entirely from the meter mounting face.

Additionally, it is known to integrally mold headed posts on a bottom side of each jaw mounting block wherein the headed posts are inserted into keyhole slots in the mounting bracket. The separate jaw mounting blocks are held in spaced relationship by a rigid member, such as the neutral lug, inserted between the jaw mounting blocks and secured to the mounting bracket. For instance, see the U.S. Pat. No. 7,291,042 B2 issued on 6 Nov. 2007 to Jeffrey L. Johnson. Though the number of fasteners is reduced by at least one, there is still a great need for a meter mounting assembly comprising a minimum number of parts wherein lay in lug caps are captive on the mounting block and the meter mounting assembly may be used for both ring type and ring less meter sealing in one size of enclosure. Additionally, there is a great need for arranging the neutral conductors adjacent the meter socket block in order to alleviate bending of four stiffer conductors out of plane thus permitting bending of only the smaller, frequently uninsulated neutral conductors to the neutral conductor channels. Furthermore, since the neutral conductor channels are disposed alongside the meter socket block, there is a greater length of neutral conductor to be bent and the additional bending space inside the enclosure permits easier bending of the neutral conductor.

It has been known at least since issuance of U.S. Pat. Nos. 3,131,984 and 3,221,216 issued on 5 May 1964 and 20 Nov. 1965 to Herman H. Kobryner to provide raised mounting buttons on the interior face of a rear wall of an enclosure for directly mounting separate jaw mounting block assemblies thereto wherein at least one of the jaw mounting blocks is adapted to have a fifth jaw affixed thereto. Still, multiple fasteners are required to retain the jaw parts to the blocks and to mount the blocks to the back wall of the enclosure. Accordingly, there is still a need for a universal mounting block assembly having a reduced number of parts that will permit mounting of either a ring type or a ring less meter seal. In addition, there is a great need for simplified conventional conductor connectors provided with simplified blade contacts having similar metal contact between a blade contact and a blade inserted therein. Furthermore, there is a need for an improved interface between a blade contact and a conductor connector.

An adapter to convert a ring less meter to a ring style in order to prevent tampering with the meter box to pilfer electricity is claimed in U.S. Pat. No. 4,505,530 issued on 19 Mar. 1985 to Robert B. Fennel. The adapter has stabs extending from a rear surface and jaws attached to the front surface, these stabs and jaws electrically connected. A ring flange is secured to the cover and to a locking flange which is in turn secured to the meter stops on the enclosure. Since an additional ring plate, mounting screws therefor, adapter and mounting screws add to the number of parts to be lost or damaged during installation there is a great need for simplicity of assembly and reduction of parts to reduce the amount of loss or damage in field installations. Additionally, there is still a need for a reversible mounting block that is internally mounted within the enclosure with the phase conductor channels fully protected from tampering by being disposed beneath the center of the meter base.

Meter jaw spring clips used to increase the contact force upon the stabs of the meter when the stabs are installed into the jaws are described in U.S. Pat. No. 4,201,439 issued on 6 May 1980 to Andre J. M'Sadoques. The '439 reference provides a "C" shaped spring clip which has its arms extend around the uprights of a jaw and has ends engaged in slots in the sides of the jaw uprights that provides reinforcement only in a specific area of the jaw uprights. An upstanding tab at the bight of the "C" functions as a guide for the meter stab as it is inserted into the jaw. There is a great need for a jaw comprising a "V" shaped bight which receives a "V" shaped tin plated copper meter spade contact therein and receives a force enhancing spring cage that is installed over the upright legs of the "V" shaped jaw to provide reinforcement along the entire length of the jaw and provides a more positive location of the meter guide tab.

Also known is an insulating jaw guide that comprises a rectangular cavity which covers the upper portions, including the tops thereof of the jaw side walls to reduce the probability of accidental contact with a live element in the meter enclosure while the meter is absent. For instance, see the U.S. Pat. No. 7,614,908 B2 issued on 10 Nov. 2009 to Fan Zhang.

Though the rectangular cavity slips over and snaps onto the jaw assembly, there is no spring contact force upon the stab engaging portion of the jaw provided by the insulating rectangular cavity. Thus, there still exists a need for spring cage that fits over a spade connector that engages an external sidewall of the extruded jaw to provide a great spring force upon the stabs of the meter along the full length of the jaw.

Finally, it is known to provide electrical connector blocks that comprise a channel and an overlying cap which slides along grooves on the outer peripheral surface of the walls. At least one of the sidewalls of the groove is provided with a stop detent along one top edge to limit movement of the cap member beyond a position of intended use. For instance, see the U.S. Pat. No. 4,640,571 issued on 3 Feb. 1987 to Walter, et al. Therefore, there is a need for a cap which may be moved along the walls of the conductor channel to a position remote from the lay in, frictionally retained in that position while the conductor is placed in the channel, readily movable to overlay the installed conductor and be tightened thereagainst, yet be readily removed from the cap groove when unserviceable by sliding the cap laterally in the cap groove against a spring assisted portion of the sidewall of the groove and tilting the cap relative to the cap groove. There is also a need for a retainer for a conductor cap which holds the cap against a base of the retainer with depending hooks.

SUMMARY OF THE INVENTION

A primary aspect of this invention is to provide a meter socket with a greater level of resistance to tampering by providing phase conductor channels inwardly of meter spade slots thus placing the phase conductor channels beneath the meter base.

Another purpose of this invention is to provide a meter socket block that has a plurality of feet depending from a lower surface of the meter socket block that cooperate with at least one lobed boss and/or lobed depression to permit installation of a ring style or ring less style meter in the same enclosure without installation of additional parts to the enclosure.

An aspect of this invention is to provide a jaw design that incorporates a snap-in tin plated copper meter spade contact retained in a spade groove of the jaw by a U-shaped spring clip fitted over the upright walls of the spade groove.

An important aspect of this invention is to provide a meter mount enclosure complying with all codes which is of reduced height while maintaining sufficient conductor bending space and required clearance.

A primary object of this invention is to simplify installation of either ring or ring less style seal by eliminating the spacers by merely rotating the meter jaw socket block.

A great feature of this invention is to provide a neutral buss that is interfaced with the meter socket block at assembly in a meter mounting enclosure for either a ring style or ring less style meter such that the neutral buss is captured between the meter socket block and thus fully engaged against the backplane of the enclosure ensuring proper grounding of the meter.

Still another great feature of this invention is to provide meter arc suppressors that engage against the neutral buss bar at assembly of the neutral buss to a meter socket block and mounting of the assembly to the backplane of the meter enclosure.

Another object of this invention is to provide a socket block with an integral track for a sliding cap disposed over each lay in phase conductor channel wherein the integral track has a clip and a tab to apply pressure to the cap to hold it in place while installing the phase conductor in the lay in channel. Likewise, the neutral lug channels may be provided with a clip and tab to retain the cap in place while installing the neutral conductor. The tab may be pulled back to the retaining position, forced against a yieldable portion of the sidewall of the cap groove and tilted relative to the cap groove to remove the cap if the cap becomes damaged.

Yet another primary object of this invention is to provide a meter socket block which has all the parts thereof assembled from the front.

Still another object of this invention is to provide for single screw mounting of the meter socket block to the enclosure.

A significant object of this invention is to provide a simplified construction for a meter enclosure and mounting block.

A significant feature of this invention is to provide a watt-hour revenue meter enclosure, mounting block and jaw assemblies therefor that greatly reduces number of parts needed for assembly thus greatly reducing assembly time of an enclosure and installation of an enclosure on a wall of a structure.

A principal aim of this invention is to provide an insulated watt-hour revenue socket block that comprises at least three rising legs to allow the meter socket to step up or recess down depending on the orientation of the meter socket block. A cooperating meter socket enclosure has raised and lowered sections on the back wall to receive the rising legs to allow stepping up or recessing down of the meter socket. The meter socket has integral cap tracks to allow the cap to be moved to a position over the center of the meter socket block and be retained in that position by a tab while inserting the phase conductor in the lay in channel.

Another principal aim of this invention is to provide a meter socket block of identical parts to reduce molding costs wherein one of the identical parts is reversed with respect to the other and the two parts joined together with integrally molded tongue and groove portions or alternately assembled to a molded medial portion with mating parts provided on the meter socket block parts and the medial portion.

Yet another principal object of this invention is to provide an enclosure for a watt-hour revenue meter that is shorter in height.

One goal of this invention is to provide a connector assembly that comprises a base, a conventional conductor connector, a blade contact superstructure and a blade contact, wherein the blade contact superstructure is appended to one sidewall of the base and wherein the blade contact superstructure further comprises generally "V" shaped blade receiving supports with a cavity therebetween, the cavity receiving the blade contact comprising a plated copper strip, the blade contact comprising an interface with an electrical blade and the superstructure.

Another goal of this invention is to provide a connector assembly that comprises a base, a conventional lay-in conductor connector, a blade contact superstructure and a blade contact, wherein the blade contact superstructure is appended to one sidewall of the base and wherein the blade contact superstructure further comprises generally "V" shaped blade receiving supports with a cavity therebetween, the cavity receiving the blade contact comprising a plated copper strip, the blade contact comprising an interface with an electrical blade and the superstructure.

Still another goal of this invention is to provide a connector assembly further comprising a reinforcing spring captured on a blade contact superstructure by being pressed against a base of a connector assembly by engagement of at least one spring tip against an upper ledge of the blade contact superstructure.

A primary goal of this invention is to provide a blade contact that is bent into a shape complementary with a cavity formed between blade receiving supports of a blade contacting superstructure appended to a conventional conductor connector or a conventional lay-in conductor connector.

Yet another primary goal of this invention is to provide a conductor cap carrier comprising a pair of parallel rails joined together by a cap retainer.

BRIEF DESCRIPTION OF THE DRAWINGS

FIG. 9 is a side view of a bottom portion of the socket block and neutral buss bar of this invention showing the engagement of certain location keys of the socket block upon an upper surface of the neutral buss bar upon orientation of the socket block for installation of a ring style meter.

FIG. 10 is an inverted perspective view of a bottom portion of the socket block and neutral buss bar of this invention showing the engagement of all location keys of the socket block with slots and holes in the neutral buss bar upon orientation of the socket block for installation of a ring less meter.

FIG. 11 is a perspective view of a conventional conductor connector having a conductor hole and a mounting tab.

FIG. 12 is a perspective view of the improved conventional conductor connector of this invention showing a blade contact superstructure, blade receiving supports and a blade contact.

FIG. 17 is a perspective view of two lay-in conductor connector assemblies of this invention showing the disconnect in phantom engaged with the blade captured in the blade contact.

FIG. 18 is a greatly enlarged exploded perspective view of a lay-in conductor connector, an alternate cap carrier, a cap retainer of the cap carrier with the conductor cap spaced below the cap retainer.

FIG. 19 is a greatly enlarged perspective view of a lay-in conductor connector provided with an alternate single ended cap carrier having a conductor cap retained in a cap retainer.

FIG. 20 is a greatly enlarged perspective view of a lay-in conductor connector provided with another alternate single ended cap carrier having a conductor cap retained in a cap retainer.

DESCRIPTION OF THE PREFERRED EMBODIMENTS

Figure 1:
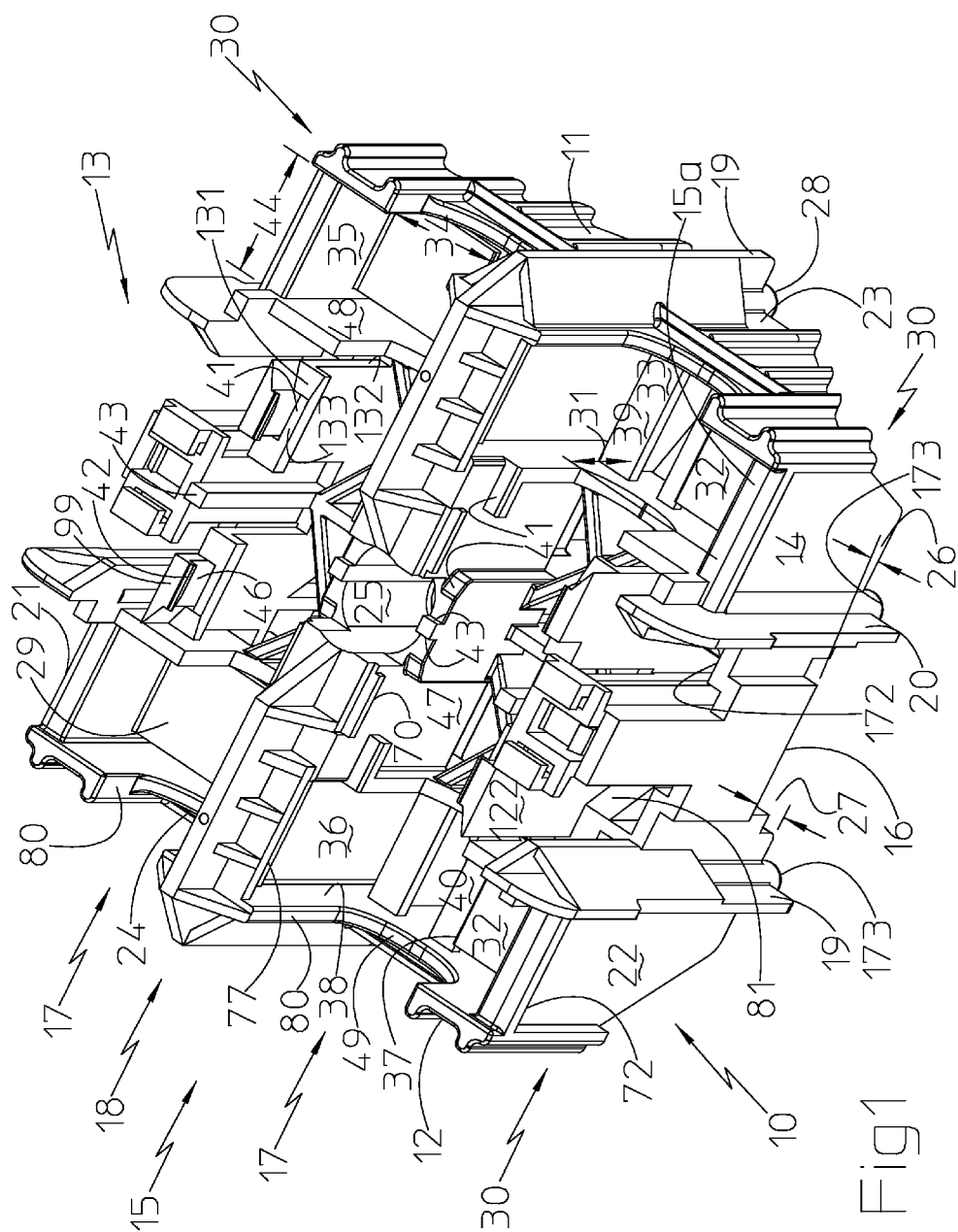
FIG. 1 is a perspective view of the preferred embodiment of the meter socket block of this invention.
Figure 2:
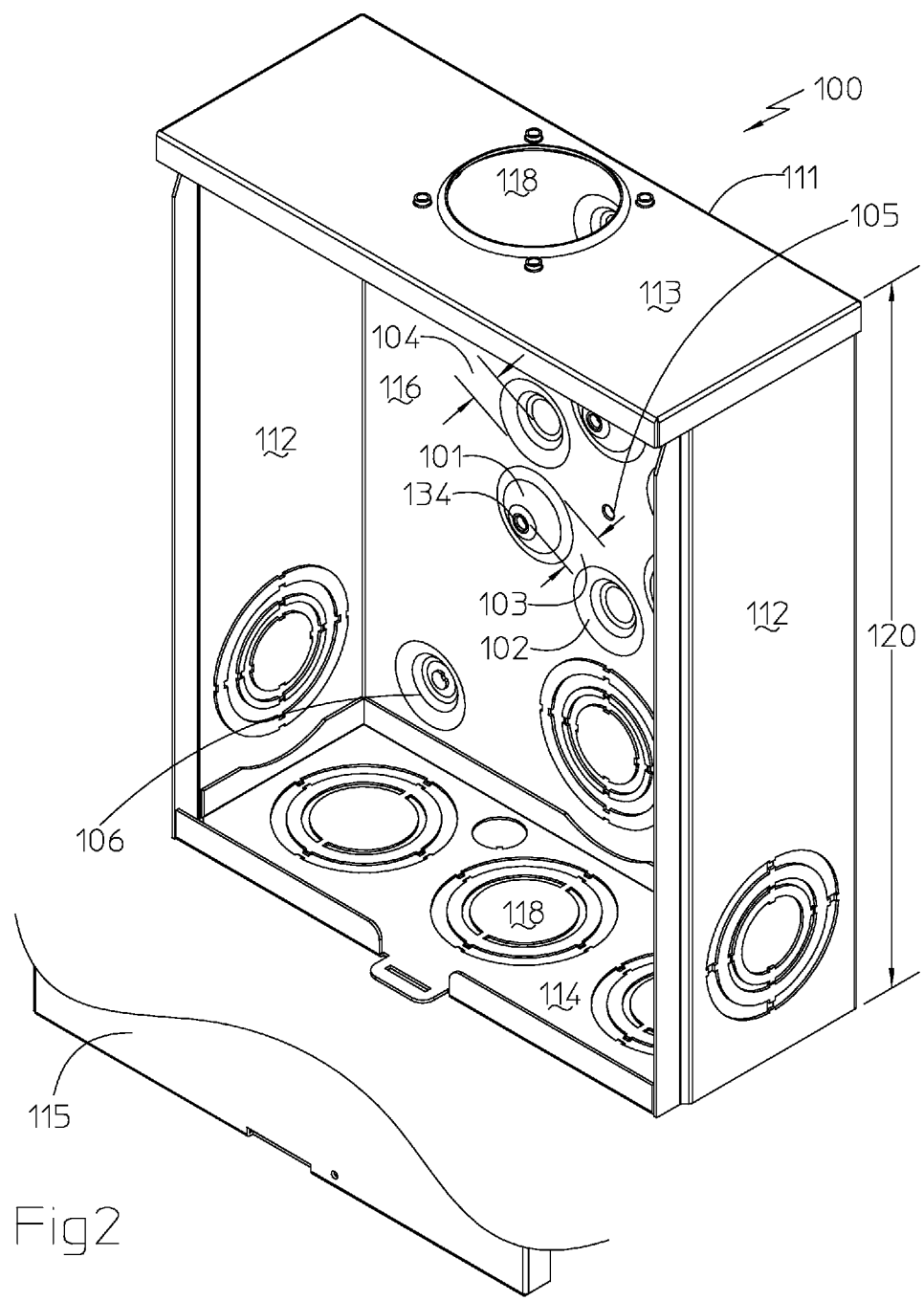
FIG. 2 is a perspective view of the preferred embodiment of the enclosure of this invention showing the bosses and depressions for mounting the meter socket block of FIG. 1.
Figure 3:
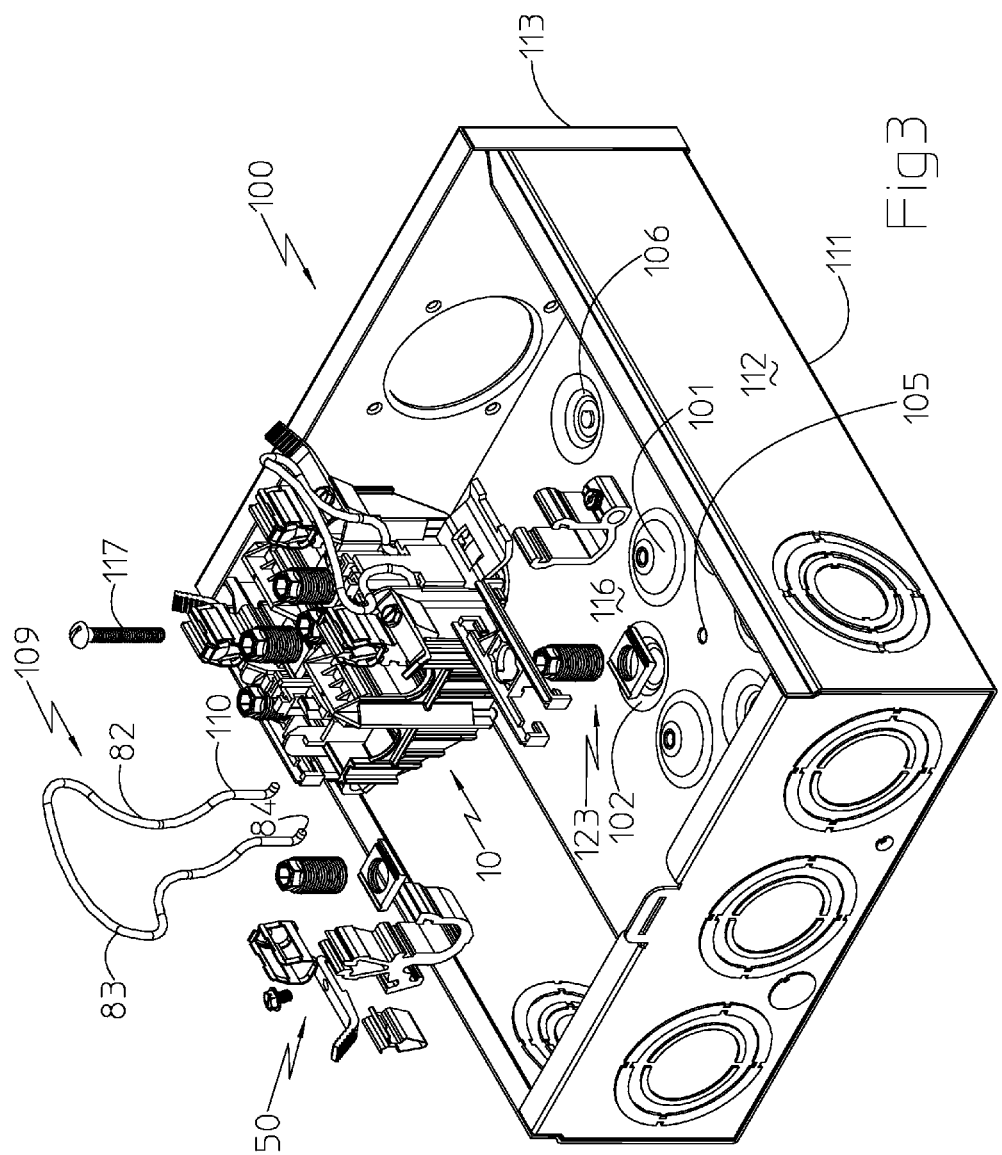
FIG. 3 is an exploded view of the enclosure and meter socket block assembly of this invention.

Referring first to FIGS. 2 and 3, an enclosure generally shown by the number 100 has a back wall 111, a pair of side walls 112, a top wall 113, a bottom wall 114 and a separable cover 115, partially shown. Back wall 111 is preferably provided with a set of three bosses 101 extending inwardly from and spaced around an inside surface 116 of back wall 111 and another set of three depressions 102 depending outwardly from and spaced around inside surface 116, bosses 101 alternately disposed with respect to depressions 102. Preferably, bosses 101 have a height 103 from inside surface 116 of back wall 111 equal to a depth 104 of depressions 102 wherein placement of bosses 101 and placement of depressions 102 from a block mounting hole 105 disposed into and through back wall 111 correspond to placement of legs 19, 20 of a meter socket block 10 from a screw mounting hole 25 disposed centrally through meter socket block 10 from top surface 15 all best shown in FIG. 1, meter socket block 10 to be described hereinafter. Back wall 111 is also provided with mounting depressions 106 in each corner thereof, only one mounting depression 106 shown, mounting depressions 106 of enclosure 100 provided to space back wall 111 of enclosure 100 from a wall. Mounting depressions 106 may be deeper than depressions 102 but should not be less. It has been found by the inventors hereof that three bosses 101 and three depressions 102 alternately arranged in a circular array provide the most economical, yet functional number of bosses 101 and depressions 102 to provide for reversible mounting of a cooperating socket block assembly as will be fully described hereinafter. Though three bosses 101 and three depressions 102 are preferred, it should be noted that any number of bosses 101 and depressions 102 may be employed and still fall within the scope of this invention. For instance, rather than provide bosses 101 and depressions 102 in the preferred circular array, bosses 101 and depressions 102 may be offset laterally, vertically or a combination thereof within enclosure 100. Additionally, bosses 101 and depressions 102 may be integrally formed wherein bosses 101 are formed as a multi-lobed structure into back wall 111 from a side thereof opposite inside surface 116 while depressions 102 lie in the cusps of the lobes of the multi-lobed structure. Bosses 101 may be formed at a total height difference between a ring style and ring less style meter seal and thus depressions 102 may be eliminated.

Referring now to FIG. 1, meter socket block, generally shown by the number 10 comprises a pair of end walls 11, 12, a pair of side walls 13, 14, a top surface 15 and a bottom surface 16. Preferably, meter socket block 10 is a right rectangular cubic structure, however, this specification does not so limit meter socket block 10 as meter socket block 10 may be circular, oval, triangular or any cubic shape while retaining the features to be hereinafter described. Still referring to FIG. 1, at least two lay in phase conductor channels 17 are disposed into top surface 15, phase conductor channels 17 substantially identical and shown in mirror image, phase conductor channels 17 separated by an insulating medial portion 18 and bounded by side walls 13, 14. Phase conductor channels 17 are effectively semi-circular cuts 49 through end walls 11 and 12 with parallel walls 80 extending upwardly therefrom and corresponding semi-circular cuts through parallel interior walls 48 of each of pockets 29, pockets 29 to be hereinafter fully described. Phase conductor channels 17 are approximately the same contour as a lay-in conductor channel 58 in base 51 of a jaw assembly 50, shown best in FIG. 5, though lay-in conductor channel 58 is narrower and not as deep to ensure that a conductor laid therein is in full contact with lay-in conductor channel 58. A plurality of legs 19, 20 are depending from bottom surface 16 adjacent external surfaces 21, 22 of side walls 13, 14 respectively and external surfaces 23, 24 of end walls 11, 12 respectively, legs 19, 20 extending below bottom surface 16 wherein legs 19 are longer than legs 20, legs 19, 20 alternately arranged on bottom surface 16 adjacent external surfaces 21-24. As measured from bottom surface 16, a height 27 of legs 19 is greater than a height 26 of legs 20 in order to allow for mounting of either a ring style or ring less meter seal within enclosure 100. It should be noted that in the preferred embodiment of the figures, legs 20 may be flush with bottom surface 16, however, legs 20 may have a height 26 extending from bottom surface 16 while legs 19 are maintained greater in height 27 than legs 20. It is further preferred that legs 19 and 20 are provided with feet 173 that have a shape and size substantially equal to a perforation 134 through bosses 101, shown best in FIG. 2, to provide for positive location of meter socket block 10 on back wall 111. Specifically, to provide a ring style meter seal in enclosure 100, meter socket block 10 is arranged such that legs 19 are placed upon raised bosses 101 of enclosure 100 with feet 173 of legs 19 seated in perforations 134 and when providing a ring less meter seal in enclosure 100, meter socket block 10 is rotated one hundred eighty degrees to place legs 19 into depressions 102, thus lowering jaw assemblies 50 and seating feet 173 of legs 20 in perforations 134. A preferred size, shape and location of feet 173 on legs 19, 20 is best observed in FIGS. 9 and 10. Legs 19, 20 may have a hollow center 28 thus removing mass from meter socket block 10. Bottom surface 16 of meter socket block 10 is also provided with a plurality of keys 180, 183, 185 and 186, the function of each to be fully explained hereinafter. Keys 180 are inward projections of legs 19 on side walls 13 and 14 proximate end wall 12, keys 180 best observed in FIG. 10. Keys 180 are provided with a notch 181 formed into an innermost end of keys 180, notch 181 provided with a bottom surface 182 that is on the same plane as a bottom surface 184 of a far key 183 and a bottom surface 187 of a close key 186, both described presently. As will become readily apparent, bottom surfaces 182, 184 and 187 of notch 181, far key 183 and close key 186, respectively, function to support meter socket block 10 in one orientation upon a neutral buss bar 127 also to be described hereinafter. In a similar manner, legs 20 of side walls 13, 14 proximate end wall 11 are provided with inwardly extending keys 185 wherein inwardly extending keys 185 and keys 180, of legs 20, 19 respectively, project through corresponding slots 174, 148 respectively while close key 186 and far key 183 project through close key hole 175 and spaced key hole 176 respectively for a second orientation of meter socket block 10 thus capturing neutral buss bar 127 thereupon. Close key 186 is arranged on bottom surface 16 of meter socket block 10 at a distance from a centerline of screw mounting hole 25 less than a distance of far key 183 from screw mounting hole 25.

Still referring to FIG. 1, meter socket block 10 has pockets 29 disposed into top surface 15, pockets 29 generally arranged at the corners 30 of meter socket block 10. Pockets 29 have a length 44 along meter socket block 10 approximately equal to a length 71a of base 51 of jaw assembly 50, these components to be fully set forth hereinafter. Pockets 29 have a depth 31 from top surface 15 approximately equal to a height 71b of base 51, depth 31 defined from top surface 15a at outer surface 22 of side wall 14 to a top surface 39 of base 33, snap tab 32 protruding from an inside surface 35 of pocket 29, depth 31 of pockets 29 at inside surface 35 of side wall 13 identical. Snap tab 32 is movable relative to a spaced apart portion 40 of base 33, snap tab 32 adapted to engage against a locking abutment 69 of base 51, snap tab 32 thus having a length 34 from an inside surface 35 of outer wall 13, 14 at least equal to distance 73 measured from locking abutment 69 of base 51 to a nose 66 of locking lip 75. As will become readily apparent, locking groove 67 rests upon top surface 15a of pocket 29 when installing jaw assembly 50 and remains engaged therewith after jaw assembly 50 is moved laterally across pocket 29 toward medial portion 18 capturing a top 76 of wall 62 of base 51 under ledge 77 of medial portion 18. Once base 51 is moved into abutment with an upright surface 36 of medial portion 18 with top 76 abutting ledge 77, snap tab 32 moves upwardly against a ledge surface 78 of base 51 with an end 37 of snap tab 32 engaged against abutting surface 69 of base 51. Since base 51 is captured under ledge 77 with bottom 79 thereof resting on rigid portion 40, locking lip 75 meshed with a protruding lip 72 at external surfaces 21, 22 of walls 13, 14 and snap tab 32 engaged against locking abutment 69, base 51 of jaw assembly 50 is firmly held in pocket 29.

Formed onto an interior surface 46 of a flexible wall 122 and surface 47 of medial portion 18 are cap ledges 41, cap ledges 41 extending between opposed pockets 29 disposed on one side of medial portion 18. Cap ledge 41 receives slidable conductor caps 52 thereon wherein conductor caps 52 are retained thereupon with cap retainers 42 and cap stop 43. Cap stop 43 is centrally located along cap ledge 41 and blocks movement of conductor cap 52 from being moved along cap ledge 41 more than a distance required to uncover phase conductor channels 17. Cap retainers 42 are located on flexible wall 122 along cap ledge 41 between cap stop 43 and each pocket 29, interior surface 46 spaced parallel to surface 47 a distance slightly less than width 45 of conductor cap 52 in order to retain conductor cap 52 in position on cap ledge 41. Opposing cap retainers 42 adjacent medial portion 18 are stationary cap retainers 70, stationary cap retainers 70 cantilevered from medial portion 18 and overlying cap ledge 41 disposed into medial portion 18. Thus, when fully engaged, conductor cap 52 is frictionally held on cap ledge 41 against medial portion 18 and on cap ledge 41 of flexible wall 122 by the springing action of flexible wall 122 as cap retainer 42 overlies cap ledge 41 of flexible wall 122 while flexible wall 122 presses against conductor cap 52. By providing flexible wall 122, conductor caps 52 can be moved to a position remote from the bared end of a phase conductor placed in conductor channel 58 of jaw assembly 50 and held there by the springing action of flexible wall 122 and cap retainer 42 while also allowing removal of a defective conductor cap 52 as follows. Preferably, in order to remove a conductor cap 52 from cap ledges 41, cap retainer 42 is moved with flexible wall 122 outwardly toward exterior side wall 13 or 14 permitting conductor cap 52 to be released from engagement under stationary cap retainer 70 disposed over cap ledge 41 of medial portion 18. Alternately, it is also possible to make cap retainers 42 upwardly flexible from flexible wall 122 and thus, in this alternate embodiment, cap retainers 42 may be lifted slightly thus allowing a conductor cap 52 to be removed from cap ledge 41 by tipping conductor cap 52 upwardly to clear cap retainer 42 and lifting conductor cap 52 from cap ledge 41 adjacent medial portion 18. In this manner, a damaged conductor cap 52 may be removed from a field installed meter socket block 10 and a new conductor cap 52 inserted in place thereof. Since cap retainers 42 may be deflected to allow conductor cap 52 to be removed by either action of flexible wall 122, or alternately, upwardly flexing of cap retainer 42, cap retainers 42 are cantilevered from at least one of interior surface 46, surface 47 or a top surface 99 of a flexible wall 122 of side walls 13/14, flexible wall 122 spaced inwardly of walls 13, 14. As will become apparent hereinafter, conductor cap 52 cannot slide beyond walls 11 or 12 as an inside surface 38 of one parallel wall 80 of phase conductor channel 17 adjacent medial portion 18 blocks movement of conductor cap 52 there beyond. At least one of cap ledges 41 is preferably also provided with a lead-in taper 131 to assist in aligning conductor cap 52 with cap grooves 59 in base 51 of jaw assembly 50 and/or to assist in sliding conductor cap 52 to a remote position while installing a conductor in phase conductor channel 17. Lead-in taper 131 is preferably disposed on a vertical edge 132 of cap ledges 41 and diverging from vertical edge 132 of cap ledges 41, though lead-in taper 131 may also be disposed on a horizontal surface 133 of cap retainer 42.

Centrally disposed in medial portion 18 is a screw mounting hole 25, screw mounting hole 25 receiving a mounting screw 117 therethrough when meter socket block 10 with jaw assemblies 50 and neutral buss assembly 123 mounted thereto is mounted to enclosure 100. Though meter socket block 10 with jaw assemblies 50 and neutral buss assembly 123 all joined together is a preferred method of mounting to enclosure 100, it is within the scope of this invention to mount only meter socket block 10 with neutral buss assembly 123 affixed thereto into enclosure 100 securing same with mounting screw 117 and thereafter insert jaw assemblies 50 into pockets 29 or assemble jaw assemblies 50 after inserting base 51 into pockets 29. Assembly of jaw assemblies 50 directly into pockets 29 is made possible as base 51 may be inserted and locked into pocket 29 from top surface 15 thus accomplishing another major aspect of this invention. Since screw mounting hole 25 is centrally located, proper orientation of meter socket block 10 is readily accomplished when either a ring style or ring less style meter seal is to be provided in enclosure 100. Furthermore, since meter socket block 10 is mounted to enclosure 100 with a single screw 117, replacement of meter socket block 10 is easily accomplished by removing the meter attached thereto, loosening conductor securing screws 53, moving conductor caps 52 against cap stops 43, removing phase conductors from lay-in conductor channels 58, loosening neutral locking screws 125, sliding neutral lug caps 124 to a position remote from an end of neutral conductors and removing neutral conductors from neutral lay-in channel 126 of neutral assembly 123, removing the single mounting screw 117 attaching meter socket block 10 to back wall 111 of enclosure 100 and removing meter socket block 10 from enclosure 100. It is also possible to change styles of meter seals within enclosure 100 in a similar manner, however, rotation of meter socket block 10 is effected after removing meter socket block 10 from enclosure 100 and a reinstallation process proceeds in essentially a reverse manner. Likewise, it should become readily apparent that since all components are front assembled, meter socket block 10 may be populated with jaw assemblies 50 after installation of meter socket block 10 in enclosure 100. In fact, as front assembly of all components is easily accomplished, a major goal of this invention has been achieved.

Formed through side walls 13, 14 are meter support ledges 81, each pair of meter support ledges 81 adapted to receive a meter arc suppressor 109 thereupon, meter arc suppressor 109 providing direct grounding to neutral buss assembly 123 as open ends 84 of meter arc suppressor 109 directly engage neutral buss bar 127 upon assembly of meter socket block 10 and neutral buss assembly 123 to back wall 111. As best shown in FIG. 3, meter arc suppressor 109 comprises a bent rigid wire loop 82 having a closed portion 83 opposite open terminal ends 84. Open ends 84 of bent rigid wire loop 82 are inserted through holes 172 in side walls 13, 14 adjacent support ledges 81, open ends 84 snapped into capturing slots disposed into underside surface 16 of meter socket block 10. Open ends 84 are snapped into the capturing slots by applying force to closed portion 83 while a step portion of bent rigid wire loop 82 is borne against support ledges 81. Disposed beneath meter socket block 10 is a neutral buss assembly 123 that is visible in closed portions 83 of meter arc suppressor 109. Removal of meter arc suppressor 109 may be done after meter socket block 10 is dismounted from enclosure 100 by squeezing wire loop 82 together adjacent bends 110 such that open ends 84 are free of capturing slots in underside surface 16 of meter socket block 10.

Figure 7:
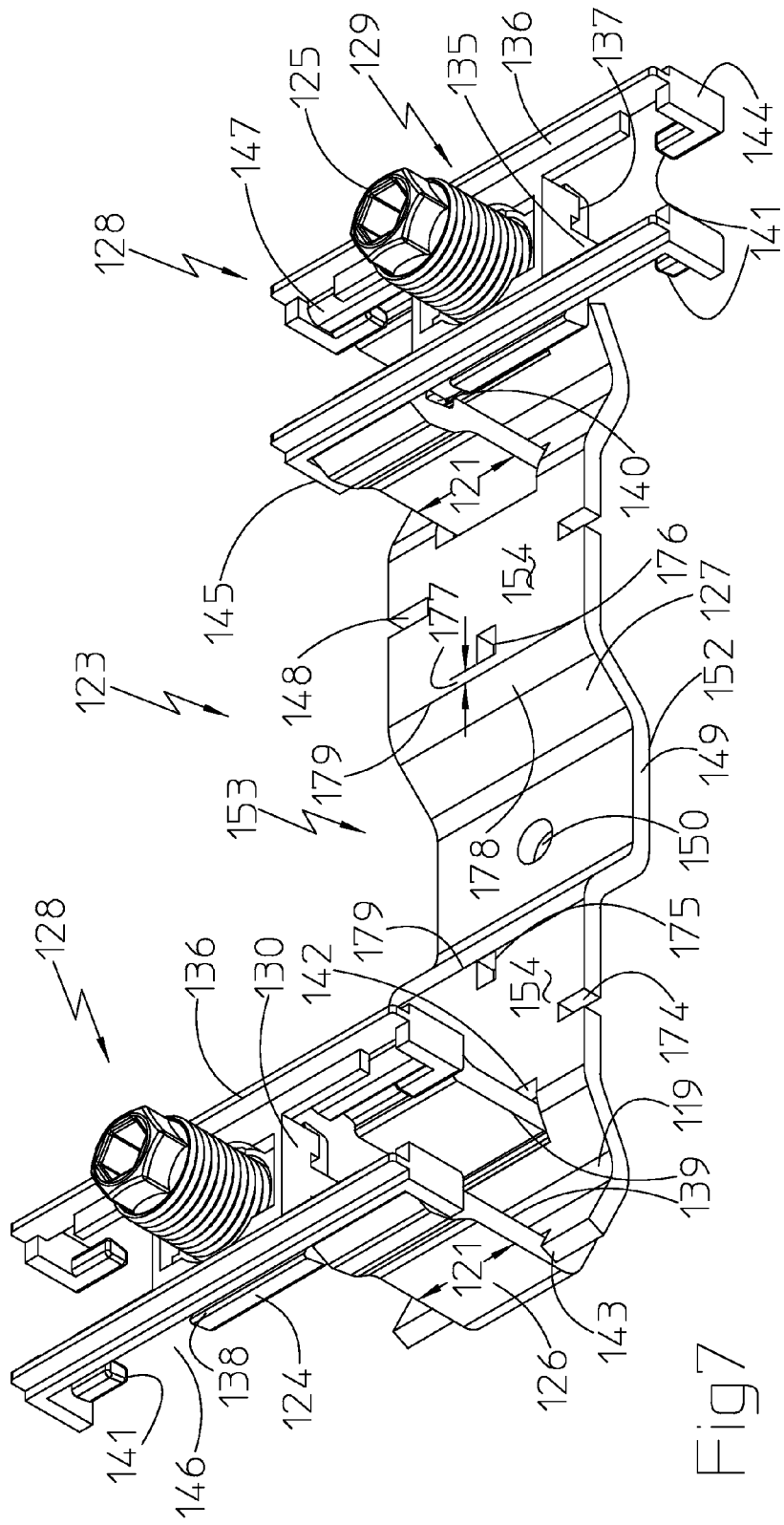
FIG. 7 is an perspective view of a neutral buss assembly of this invention.

Referring now to FIG. 7, neutral buss assembly 123 preferably has two neutral lay-in "U" shaped channels 126 connected to opposed ends of a neutral buss bar 127, neutral buss bar 127 secured to enclosure 100 with block mounting screw 117 thus capturing neutral buss assembly 123 between meter socket block 10 and back wall 111 of enclosure 100. Neutral conductor lay-in channels 126 are provided with snap on cap carriers 128. Cap carriers 128 capture neutral conductor caps 124 in a central portion 129 with hooks 135 depending downwardly from a cap retainer 130 made fast to rails 136 of cap carrier 128. Neutral conductor caps 124 are captured between hooks 135 and a bottom surface 137 of cap retainer 130, cap retainer 130 holding grooved edges 138 of neutral conductor cap 124 in alignment with locking grooves 140 disposed into opposed walls 139 of "U" shaped channels 126. Neutral buss bar 127 has slots 142, 143 disposed through buss bar 127 perpendicular to buss bar 127 wherein "U" shaped channels 126 are inserted into slots 142 and 143 of neutral buss bar 127 and retained in slots 142, 143 by means known in the art. As walls 139 of neutral buss bar 127 are perpendicular to neutral buss bar 127 and inserted through slots 142, 143, a neutral lay-in channel 119 of neutral buss bar 127 is adapted to receive a neutral conductor therein and thus the neutral conductor is also disposed perpendicular to buss bar 127. Upon assembly of meter socket block 10 within enclosure 100, "U" shaped channels 126 may be, and preferably are, engaged against back wall 111 of enclosure 100. Rails 136 of cap carrier 128 rest upon a top surface 147 of "U" shaped channels 126 and are provided with inwardly facing projections 141 at both ends 144, 145 thereof, projections 141 having a shape generally corresponding to groove 140 of opposed walls 139 of "U" shaped channels 126 such that projections 141 may be inserted into groove 140 when sliding cap carrier 128 to a lay-in position shown in FIG. 7. Once a neutral conductor is placed in "U" shaped channel 126, cap carrier 128 is moved longitudinally along top surface 147 and groove 140 carrying neutral conductor cap 124 therealong and engaging grooved edges 138 of neutral conductor cap 124 into grooves 140 before projections 141 are disengaged from grooves 140 as a gap 146 between projections 141 and conductor cap 124 is less than a length 121 of "U" shaped channels 126. Thus, the entirety of cap carrier 128, neutral conductor cap 124 and locking screw 125 move longitudinally along top surface 147 and grooves 140 while moving to a lay-in position as shown or to a conductor engaging position wherein neutral conductor caps 124 and locking screws 125 are disposed directly over neutral conductors placed in "U" shaped channels 126. Once neutral conductor cap 124 is fully engaged in "U" shaped channel 126, projections 141 are fully disengaged with groove 140 in "U" shaped channels 126. In fact, it is this position at which snap on cap carriers 128 are placed upon neutral conductor cap 124, it being understood that to position snap on cap carrier 128, it is first required that neutral conductor cap 124 be fully placed into groove 140 of "U" shaped channels 126, snap on cap carrier 128 aligned with cap retainer 130 in central portion 129 positioned over neutral conductor cap 124 with hooks 135 disposed on opposed ends of neutral conductor cap 124 whereupon snap on cap carrier 128 has hooks 135 forced apart while inserting cap retainer 130 over neutral conductor cap 124.

Figure 6:
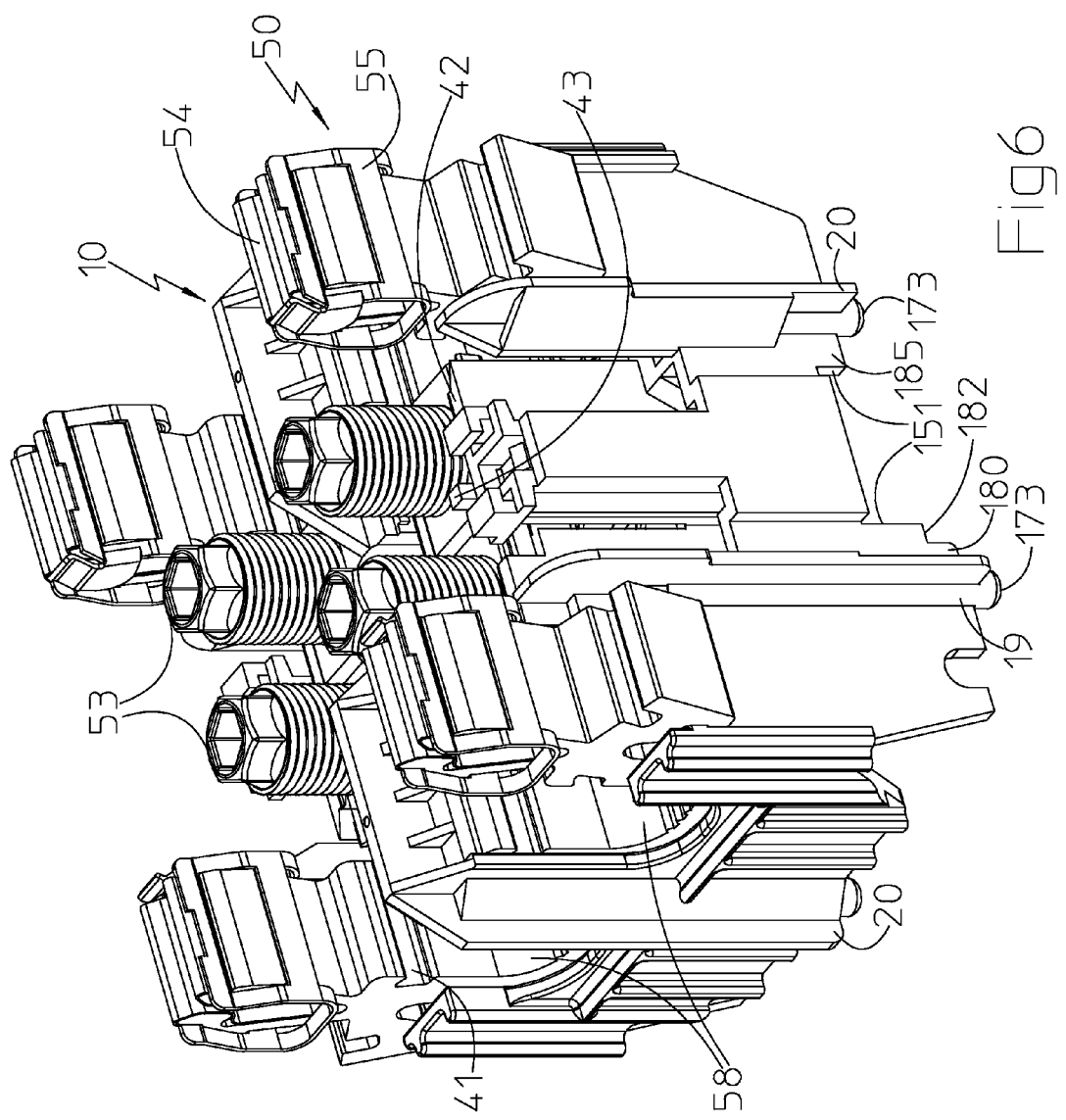
FIG. 6 is an enlarged view of the meter block assembly of this invention.

Still referring to FIG. 7 and also to FIGS. 6, 9 and 10, long key slots 148 and short key slots 174 are provided into opposed edges of neutral buss bar 127, long key slots 148 adapted to receive long keys 180 of ribs 151 on end wall 12 of bottom surface 16 and short key slots 174 adapted to receive short keys 185 of ribs 151 of end wall 11 of meter socket block 10 when meter socket block 10 is rotated into an orientation for a ring less meter installation as shown in FIG. 10, neutral buss bar 127 captured between bottom surface 16 of meter socket block 10 and back wall 111 of enclosure 100 at assembly of meter socket block 10 with enclosure 100. Neutral buss bar 127 has close key hole 175 formed through flat 154 adjacent to a break line 179 of sloped surface 178 and spaced key hole 176 formed through flat 154 at a distance 177 from break line 179 of sloped surface 178 wherein close key hole 175 and spaced key hole 176 may be aligned with mounting hole 150. Thus, when meter socket block 10 is rotated into the ring less meter installation orientation of FIG. 10, close key 186 and far key 183 disposed on bottom surface 16 of meter socket block 10 are engaged fully through close key hole 175 and spaced key hole 176 disposed into flats 154 of neutral buss bar 127 and flats 154 of top side 153 of neutral buss bar 127 engage with bottom surface 16 of meter socket block 10. Neutral buss bar 127 has bottom surface 152 engaged with back wall 111 of enclosure 100 and flats 154 neutral buss bar 127 substantially engaged against bottom surface 16 of meter socket block 10. When a ring style meter is to be installed in enclosure 100, bottom 152 of dimple 149 of neutral buss bar 127 is still adapted to be engaged directly against back wall 111 of enclosure 100 with bottom surfaces 182 of notch 181 of legs 19 on side walls 13, 14 of meter socket block 10 and bottom surface 184 of far key 183 and bottom surface 187 of close key 186 engaged with flats 154 of top surface 153 of neutral buss bar 127 wherein top surface 153 is spaced from bottom surface 16. Therefore, when meter socket block 10 is rotated into the ring style meter installation orientation of FIG. 9, close key 186 and far key 183 disposed on bottom surface 16 of meter socket block 10 rest upon flats 154 adjacent spaced key hole 176 and close key hole 175 respectively and cooperate with bottom surfaces 182 of notches 181 to space bottom surface 16 of meter socket block 10 above flats 154 of neutral buss bar 127. It should also be readily apparent that in the ring style meter installation orientation of FIG. 9, meter socket block 10 is supported on neutral buss bar 127 as described above and also upon bosses 101 of enclosure 100. In either installation, mounting screw 117 is installed through hole 25 in meter socket block 10 and mounting hole 150 in dimple 149 of neutral buss bar 127 and into mounting hole 105 of enclosure 100 wherein mounting hole 105 of enclosure 100 may be, and preferably is, provided with a thread.

Figure 5:
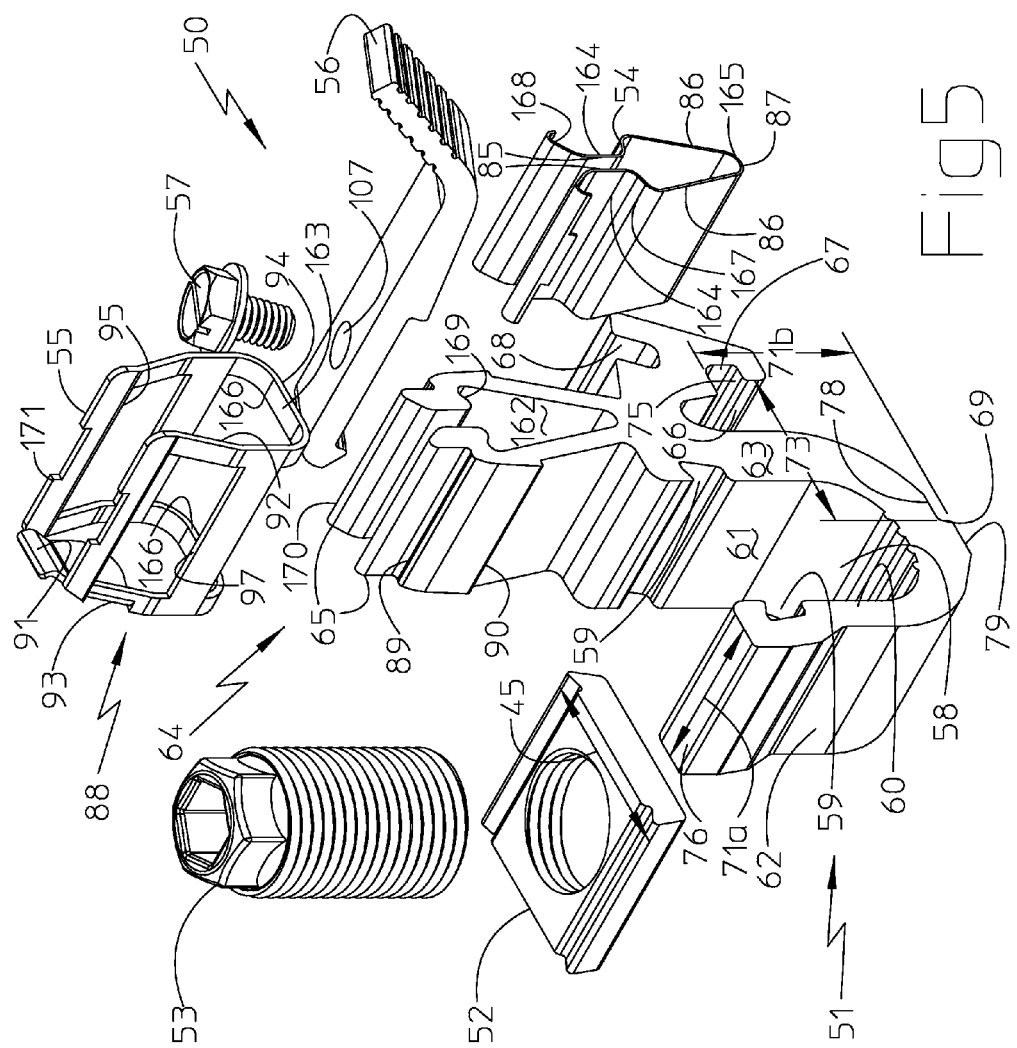
FIG. 5 is an exploded perspective view of one jaw assembly of this invention.

Referring now to FIG. 5, jaw assembly is generally shown by the number 50 and comprises a base 51, slidable conductor cap 52, securing screw 53, a tin plated copper meter blade contact 54, a reinforcing spring 55, a horn bypass 56 and bypass securing screw 57. Base 51 is preferably an extruded metallic member having a "U" shaped lay in conductor channel 58, a cap groove 59 in disposed into internal surfaces 60, 61 of sidewalls 62, 63 thereof and a locking abutment 69, locking abutment 69 disposed into an external bottom surface 79 of base 51, cap groove 59 adapted to receive conductor cap 52 slidably therein. Base 51 further has a blade contacting superstructure 64 appended to sidewall 63, blade contacting superstructure 64 further comprising meter blade contact receiving supports 65, a locking groove 67 and a bypass mounting groove 68. Since conductor channel 58, superstructure 64 and its components, locking groove 67, bypass mounting groove 68, locking abutment 69 are longitudinally disposed, it is readily apparent that base 51 is best formed by extruding an elongated bar of metallic material and cutting individual bases 51 therefrom thus making base 51 very economical to produce. It should also be readily apparent that base 51 may be formed by other known operations such as die casting, shaping, milling or combinations thereof.

Figure 13:
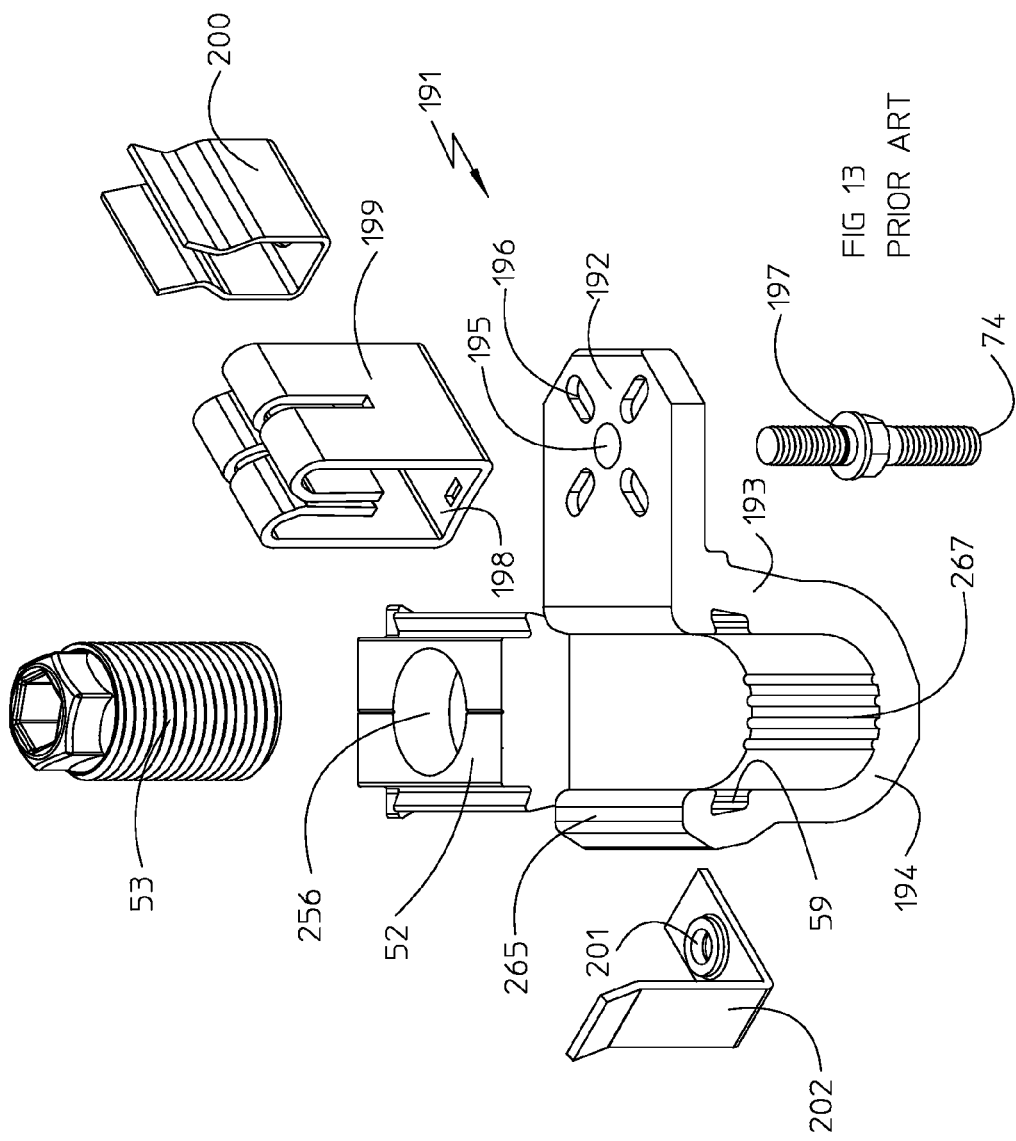
FIG. 13 is a perspective view of a conventional lay-in conductor connector having a conductor channel and a tab for affixing a blade receiver and affixing the connector to a bussbar.

Referring now to FIG. 13 a conventional lay in connector 191 is shown which has a horizontal tab 192 extending from a sidewall 193 of a base 194, tab 192 provided with a through hole 195 and a plurality of radial slots 196 around through hole 195. A stud 197 is adapted to be inserted through through hole 195, through a base 198 of a blade receiver 199, threaded into a threaded hole 201 in a blade stop 202 and finally through an internal spring 200 thereby confining internal spring 200 in blade receiver 199. Stud 197 also is adapted to be inserted into a hole (not shown) in an insulator base (not shown) and affixed thereto with a nut (not shown) threaded upon the free end 74 of stud 197 and tightened against the insulator. As discussed previously, a conductor cap 52 is adapted to be inserted into cap grooves 59 in the upper ends 265 of sidewalls 193 of base 194 whereupon a conductor securing screw 53 is inserted into the threaded hole 256 in conductor cap 52 for tightening against a conductor laid in the lay in channel 267 of conventional lay in connector 191. As is readily observed, four parts, blade receiver 199, internal spring 200, blade stop 202 and stud 197 are required to provide and secure blade receiver 199 on tab 192.

Figure 14:
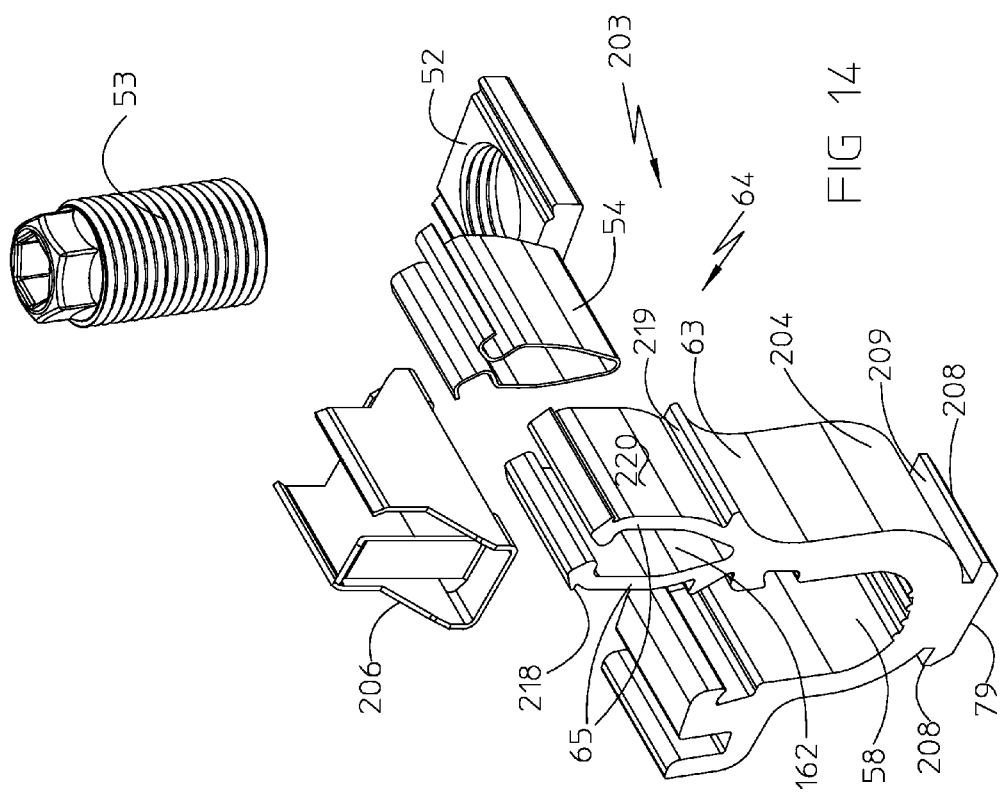
FIG. 14 is an enlarged exploded perspective view of a conventional conductor connector of this invention showing the blade contact superstructure, the plated blade contact and the alternate reinforcing spring of FIG. 15.

The lay-in conductor connector assembly of this invention for conventional lay-in conductor connectors shown in FIG. 14 is generally denoted by the numeral 203. Lay-in conductor connector 203 is similar to the jaw assembly connector of FIG. 5 and comprises a base 204 having the bottom 79 thereof configured for complementary engagement with an insulating block associated with a metallic mounting framework. As in FIG. 5, lay-in conductor connector 203 has a conventional lay in conductor connector channel 58, a blade contact superstructure 64, a blade contact 54, a conductor cap 52 and a conductor securing screw 53. Base 204 has blade contact superstructure 64 appended to one sidewall 63 thereof, blade contact superstructure 64 further comprising generally "V" shaped blade receiving supports 65, blade receiving supports 65 defining a cavity 162 therebetween. Blade contact 54 is preferably a plated copper strip wherein blade contact 54 is disposed in cavity 162, blade contact 54 thus comprising an interface with superstructure 64 and a well known stab blade of a meter or an electrical disconnect blade 205 as shown in FIG. 17. Thus, an object of improving the electrical contact between electrical blade 205 and superstructure 64 is achieved by insertion of blade contact 54 within cavity 162, retaining blade contact 54 within cavity 162, as will be described hereinafter and forcing blade receiving supports 65 tightly together with reinforcing spring 55 of FIG. 5, alternate reinforcing spring 206 of FIG. 15 or alternate reinforcing spring 207 of FIG. 16.

Base 204 is provided with at least one locking ledge 208 formed into bottom 79 thereof, locking ledge 208 extending outwardly from a groove 209 formed into base 204. Each locking ledge 208 may then be engaged by a capturing mechanism of an insulator wherein the insulator is made integral with a metal mounting framework. The capturing mechanism may engage each locking ledge 208 with at least one parallel insulating bar of the insulator, inserted through a hole in the insulator and captured therein by at least one complementary ledge at the bottom of the hole in the insulator, captured between a locking snap tab 32 and a rigid portion 40 of a base 32 of the insulating bar, captured between two locking snap tabs 32 of the insulating bar or captured by at least one movable complementary ledge in the insulating bar.

Figure 15:
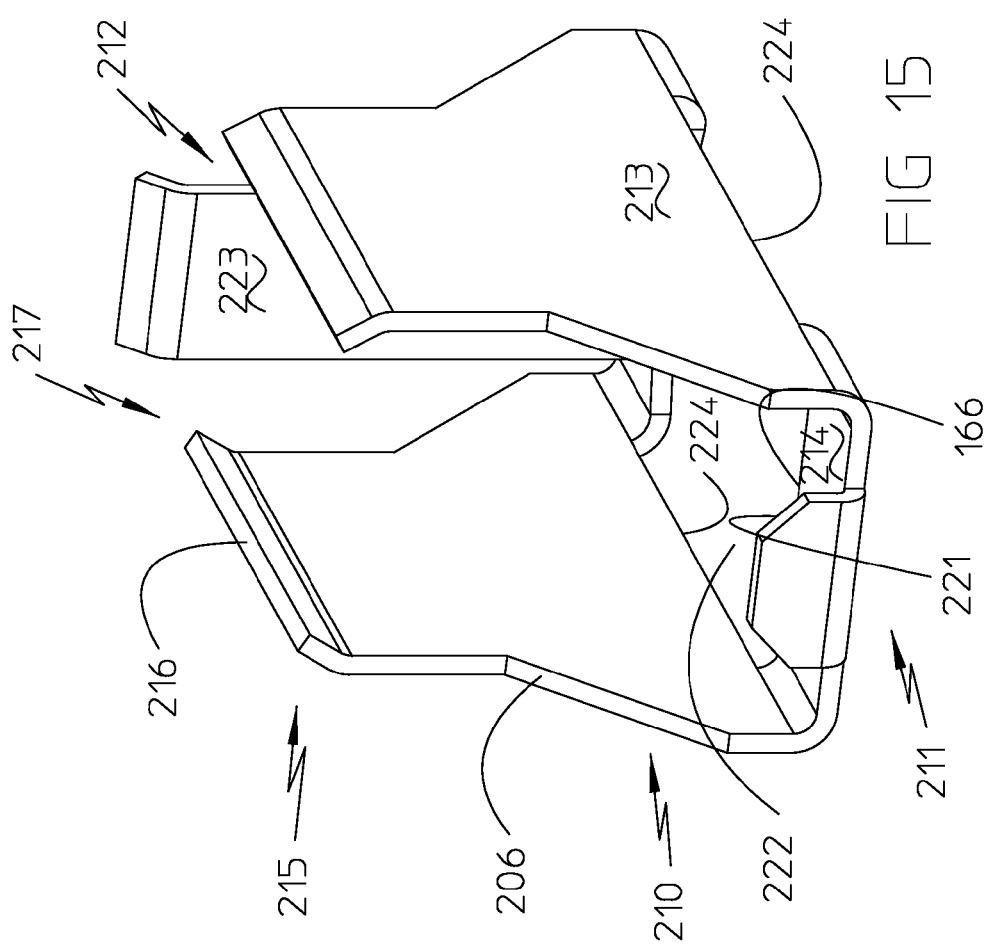
FIG. 15 is a greatly enlarged perspective view an alternate reinforcing spring for the blade contact superstructure.

Referring specifically to FIG. 15, lay-in conductor connector assembly 203 of FIG. 14 further comprises a reinforcing spring 206, reinforcing spring 206 comprising a generally "U" shaped cage 210 having terminal ends 211, 212, generally straight sides 213 provided with inwardly formed upper ends 215 and a base 214. Straight sidewalls 213 extend upwardly from base 214, straight sides provided with an upper ledge 216 at an engaging end 217 of inwardly formed upper ends 215. Upper ledge 216 at engaging ends 217 is adapted to engage under upper ledge 218 disposed into upright receiving supports 65 while base 214 is adapted to rest upon lower ledge 219 of superstructure 64. At assembly of lay-in conductor connector assembly, blade contact 54 is inserted into cavity 162 between upright receiving supports 65 whereupon reinforcing spring 206 is inserted over superstructure 64 with a hole 222 in base 214 passing over upright receiving supports 65 with blade contact 54 in place in cavity 162. Lower ledges 224 of sidewalls 213 of reinforcing spring 206 engage against lower ledge 219 of superstructure 64 and engaging ends 217 of inwardly turned ends 215 of sidewalls 213 are forced downwardly until upper ledges 216 of engaging ends 217 snap below upper ledge 218 of upright receiving supports 65. When upper ledges 216 snap into place below upper ledge 218, reinforcing spring 206 is captured upon upright receiving supports 65 and engaging ends 217 bear against outer surfaces 220 of upright receiving supports 65 thus forcing upright receiving supports 65 inwardly toward each other to provide the necessary force to keep blade contact 54 in firm contact with an electrical blade 205 inserted therein. Reinforcing spring 206 is formed from a single piece of spring steel by first stamping out a flat shape forming sidewalls 213, bending upwardly an optional reinforcing flange 221 at terminal end 211, bending upwardly a blade stop/blade contact stop 223 of terminal end 212 from metal in base 214 while removing remaining material thus forming hole 222. Reinforcing flange 221 on terminal end 211, sidewalls 213 and blade stop/blade contact stop 223 on terminal end 212 are then bent upwardly into the positions shown in FIG. 15. Of course, it is well known that reinforcing spring 206 may be formed in a progressive die whereupon all elements are formed in stages.

Figure 16:
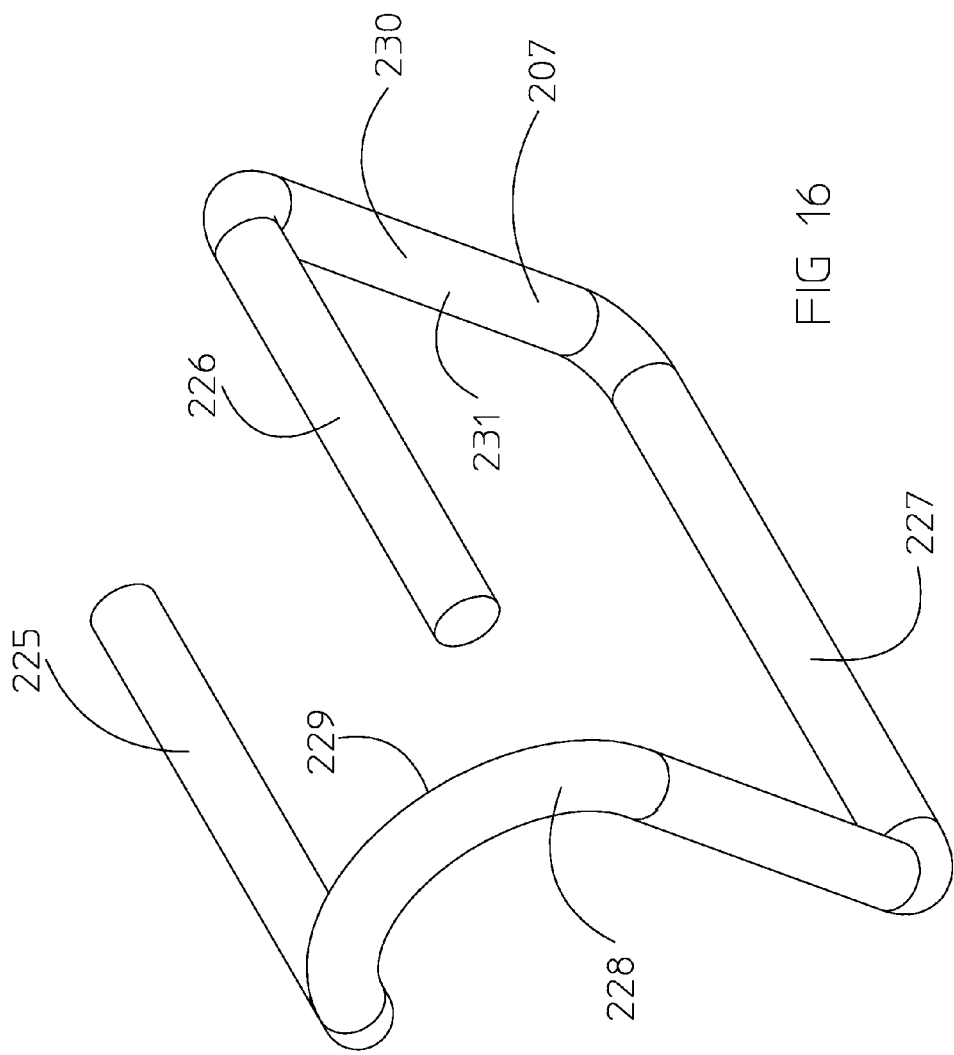
FIG. 16 is a greatly enlarged perspective view of another alternate reinforcing spring for the blade contact superstructure.

Referring now specifically to FIG. 16, lay-in conductor connector assembly 203 may alternately have a bent wire reinforcing spring 207 that has a lower leg 227 that rests in cavity 162 of superstructure 64, bent wire reinforcing spring 207 having free ends 225, 226 engaged against and under upper ledge 218 of superstructure 64. Lower leg 227 is adapted to rest in cavity 162 having free end 225 and free end 226 running parallel to lower leg 227, free ends 225, 226 are locked under ledges 218 on opposed upright receiving supports 65, capturing blade contact 54 between an inner edge 229 of curved portion 228 and inside surface 231 of straight leg 230. In a similar manner, straight leg 230 is disposed at a right angle from free end 226 and lies across a lower end of cavity 162 between upright receiving supports 65 thus having an inside surface 231 of straight leg 230 engaging one end 165 of loop 87 of blade contact 54 and therefore cooperating with curved portion 228 to retain blade contact 54 in cavity 162. Bent wire reinforcing spring 207 is preferably formed from a length of spring steel rod and bent into the configuration shown in FIG. 16. Since lower leg 227 resides inside cavity 162 of superstructure 64, free end 225 and free end 226 bear against upper ledge 218 on the opposite sides of superstructure 64, lower leg 227 is in torsion thus providing the substantial spring force against outer surfaces 220 of upright receiving supports 65 necessary to provide for a strong positive contact of blade contact 54 with an electrical blade 205 inserted therein. Again, the objective of providing a sure interface between an electrical blade 205 and superstructure 64 has been achieved.

Referring now to FIG. 12, a conventional conductor connector assembly 232 comprises a base 233, a conventional conductor connector hole 234, a blade contact superstructure 64 and a blade contact 54. Base 233 is provided with blade contact superstructure 64 appended to one side edge 235 of base 233, blade contact superstructure 64 further comprising generally "V" shaped blade receiving supports 65, only one end thereof visible, wherein blade receiving supports 65 define a cavity 162 therebetween. As hereinbefore described, blade contact 54 is a plated copper strip disposed in cavity 162 wherein blade contact 54 comprises an interface with an electrical blade 205 and superstructure 64. As previously described, reinforcing spring 206, 207 or 55 wherein the selected reinforcing spring 55, 206, 207 captures ends 236 of blade contact 54 to retain blade contact 54 laterally within cavity 162 of blade receiving supports 65. As also previously described, reinforcing spring 206 is provided with a blade stop/blade contact stop 223 and reinforcing flange 221 wherein blade stop/blade contact stop 223 engages one end 165 of loop 87 of blade contact 54 and inside edge 166 engages the opposed end 165 of loop 87 thus retaining blade contact 54 within cavity 162. Alternately, of course, alternate spring 207 may be used to reinforce blade receiving supports 65 in a manner described above. Additionally, it is possible to use spring 55 to support blade receiving supports 65 and capture blade contact 54 within cavity 162 as blade contact 54 is bent into a shape complementary with cavity 162. It is fully understood that base 233 has bottom 79 thereof configured for complementary engagement with an insulating block associated with a metallic mounting framework in a manner similar to mounting of lay-in conductor connector assembly 203, base 233 provided with locking ledges 208 and grooves 209 at bottom 79 thereof. In contrast, FIG. 11 shows a conventional conductor connector 238 provided with a tab 237 which may be adapted to receive the four part blade contact described with respect to the conventional lay-in conductor connector of FIG. 13, however the common use for conventional conductor connector is to attach tab 237 to a buss bar to provide power to, or receive power from the buss bar.

Reference is now made to FIG. 17 wherein lay-in connector assembly 203 of FIG. 14 is provided with a spring 260, similar to spring 206, however, spring 260 does not have blade stop/blade contact stop 223 at terminal end 212 but rather is provided with reinforcing flange 221 at both terminal ends 211, 212 thereof. Thus, lay-in connector assembly 203 with spring 260 is used to bypass an electrical meter wherein electrical blade 261 is used for connecting the powered buss bar 262 of the meter directly to the bypass terminal 263 or connecting the buss bar 262 to the meter terminal 264. In this manner, the electrical meter may be removed from service without interrupting electrical service to the connected load. It is fully understood that lay-in connector 203 with spring 260 may also be used in other electrical installations.

Referring now to FIG. 18, a conventional conductor connector assembly 239 comprises a base 240, a conventional lay-in conductor channel 242, a conventional conductor cap 52, a securing screw 53 and a conductor cap carrier 241. Conductor cap carrier 241 comprises a pair of parallel rails 243, parallel rails 243 joined together by a cap retainer 244. Parallel rails 243 are provided with external runners 245 which are adapted to fit within cap grooves 248 disposed adjacent upper ends 250 of sidewalls 249 of conventional lay-in conductor channel 242. External runners 245 terminate in inwardly facing projections at least one end thereof, inwardly facing projections comprising runner stops 246 to stop movement of cap carrier 241 along cap grooves 248. Cap retainer 244 receives conductor cap 52 upwardly toward a bottom surface 251 of cap retainer 244, conductor cap 52 moved into engagement with a bottom surface 251 and held thereagainst by hooks 247 depending downwardly from cap retainer 244 wherein hooks 247 engage a bottom surface 252 of conductor cap 52. Conductor cap 52 for retaining a conductor in conventional conductor channel 242 is provided with parallel grooved edges 253 complementary to cap grooves 248 in sidewalls 249 of base 240 wherein grooved edges 253 on opposed sides 254 of conductor cap 52 align with runners 245 when conductor cap 52 is captured in cap retainer 244 thus allowing cap carrier 241 to carry conductor cap 52 from a disengaged position on either end 255 of base 240 to an engaged position substantially centrally located on base 240. It is preferred that grooved edges 253 of conductor cap 52 and runners 245 are disposed in abutting relationship though it should be fully understood that as grooved edges 253 are aligned with runners 245, it is only necessary that a portion of runners 245 and grooved edges 253 be engaged with cap grooves 248 during movement of cap carrier 241 from a disengaged position to an engaged position. It is also preferred that runners 245 are of sufficient length to ensure that conductor cap 52 is completely removed from engagement with base 240 such that conductor cap 52 may be inserted or removed from cap carrier 244 and that substantially the entire length of conventional conductor channel 242 is available for laying in of a conductor. Preferably, runners 245 frictionally engage cap grooves 248 of base 240 to thus retain cap carrier 241 in any position along cap grooves 248. Though conventional lay in conductor channel 242 is a generally "U" shaped channel it should be fully understood that other open ended shapes are within the scope of this invention. Conductor cap 52 is provided with a screw hole 256 therethrough, screw hole 256 receiving conductor securing screw 53 therein.

FIG. 19 is provided with a cap carrier 257 essentially identical to cap carrier 241 of FIG. 18 though cap carrier 257 has runners 245 of inwardly facing rails 243 extending only from one end 259 of cap retainer 244. Runners 245 are provided with runner stops 246 in the same manner as described with regard to FIG. 18 and it is preferred that runners 245 frictionally engage cap grooves 248 of base 240 to thus retain cap carrier 257 in any position along cap grooves 248.

FIG. 20 is provided with a cap carrier 258 engaged with cap grooves 248 of base 240, cap carrier 258 essentially identical to cap carrier 128 of FIG. 7 though cap carrier 258 has runners 245 extending only from one end 266 of cap retainer 244. Runners 245 are provided with runner stops 144 in the same manner as described with regard to FIG. 7 and it is preferred that runners 245 frictionally engage cap grooves 248 of base 240 to thus retain cap carrier 258 in any position along cap grooves 248.

Meter blade contact 54 is a tin plated copper strip bent into a shape generally shown in FIG. 5 with blade contact portions 85 internally disposed with respect to support uprights 86, support uprights 86 terminating in a closed loop 87. Meter blade contact 54 is inserted into cavity 162 between upright receiving supports 65 by pinching together upright walls 164 of meter blade contact 54 such that blade contact portions 85 touch. Meter blade contact 54 must then be retained in place by reinforcing spring clip 55 inserted over upright receiving supports 65 capturing ends 165 against inside edges 166 of reinforcing spring clip 55. Meter blade contact 54 is prevented from being pulled upwardly when removing a meter by bends 167 provided in upright walls 164 of meter blade contact 54, bends 167 captured under hooks 169 in upright receiving supports 65. Meter blade contact 54 is further prevented from being depressed further into cavity 162 as hooks 168 at upper ends of upright walls 164 fit over top surfaces 170 of upright receiving supports 65. Reinforcing spring clip 55 comprises a cage 88 having terminal ends 93, 94, inwardly curved sides 92 and a base 163, terminal end 93 provided with a blade stop 91. Curved sides 92 extend upwardly and inwardly from base 163 and are provided with ledges 95, 97 therealong, ledges 95, 97 adapted to be engaged on top ledge 89 of upright receiving supports 65 and be captured thereupon by standing on top ledge 89 and hooking under ledge 90. After meter blade contact 54 is inserted into cavity 162, reinforcing spring clip 55 is placed over top surfaces 170 of upright supports 65 and forced downwardly to allow for engagement of cage ledges 97 with under ledges 90 and allowing ledges 95 to engage top ledges 89 of upright receiving supports 65. Upper arms 171 of reinforcing spring clip 55 then provide a resisting force against upright receiving supports 65 thus providing additional clamping force for a meter blade inserted into meter blade contact 54. Blade stop 91 at end 93 of reinforcing spring clip 55 prevents meter blade inserted into meter blade contact 54 from moving laterally along meter blade contact 54 to positively locate a meter within meter socket block 10. Referring now to FIG. 6, jaw assemblies 50 are shown fully assembled into meter socket block 10 with securing screws 53 retracted fully and conductor caps 52 engaged against cap stops 43 and held in place by cap retaining tabs 42. Conductor channels 58 are thus open from a top thereof for receiving line and load conductors therein. Conductor caps 52 are retained essentially against cap stops 43 by cap retaining tabs 42 to hold conductor caps 52 clear of conductor channels 58 to facilitate loading of line and load conductors therein. Conductor caps 52 are prevented from sliding clear of cap ledges 41 and potentially being lost in a wiring conduit as cap ledges 41 terminate at inside surface 38 of end walls 11 and 12. It should be readily apparent therefore, that meter socket block 10 of this invention provides for simpler assembly and simpler, more efficient installation of meter enclosures 100 for meters and accordingly, another major object of this invention is achieved. It should also be readily apparent that with conductor channels 58 centrally disposed in meter socket block 10 that line and load conductors placed and secured into conductor channels 58 are disposed beneath a meter inserted into meter blade contacts 54 as meter jaw assemblies 50 are arranged outwardly of conductor channels 58. Thus conductor channels 58 are directly under a meter inserted into meter socket block 10 and access to the line and load conductors in conductor channels 58 is severely limited, in fact essentially denied. Therefore, a major objective of preventing meter tampering, or certainly providing considerable resistance thereto is met by the meter socket block 10 of this invention.

An optional horn bypass 56 is provided on base 51 for providing electrical service when a meter is removed from meter blade contacts 54, horn bypass 56 received in bypass mounting groove 68 formed into superstructure 64 of base 51. Horn bypass 56 is affixed to superstructure 64 with a bypass securing fastener 57 disposed through a securing hole 107 and into bypass mounting groove 68. Bypass securing fastener 57 is preferably a thread forming threaded bolt that is inserted through hole 107 into bypass mounting groove 68, however bypass securing fastener 57 may be any other suitable fastener to secure horn bypass 56 to superstructure 64.

Horn bypass 56 is then secured into bypass mounting groove 68 with bypass fastener 57 passing through horn bypass 56 and into bypass mounting groove 68 and jaw assembly 50 comprising only five parts fully assembled. Though conductor cap 52 and conductor securing screw 53 may be considered to be a part of jaw assembly 50, conductor cap 52 and conductor securing screws 53 of all jaw assemblies 50 are counted in the total part count upon assembly of meter socket block 10. Assembly of all four jaw assemblies 50 is done exactly as described above until ready to assemble jaw assemblies 50 into meter socket block 10. Meter arc suppressor 109 has open ends 84 inserted into holes 172 in meter socket block 10 with bends 110 resting upon support ledges 81 thus retaining meter arc suppressor 109 onto meter socket block 10.

Referring to FIGS. 1 and 3, conductor caps 52 with conductor retaining screws 53 partially screwed thereinto are placed under cap retaining tabs 42 and abutted against cap stop 43 whereafter a jaw assembly 50 is then inserted into each pocket 29 of meter socket block 10 with bottom 79 of base 51 of jaw assembly 50 initially resting upon snap tab 32. Each jaw assembly 50 is then forced downwardly into pocket 29 of meter socket block 10 until snap tab 32 aligns with fixed portion 40 of base 33 and locking groove 67 comes into contact with upper surface 15a of wall 13 or 14. Jaw assembly 50 is then moved toward medial portion 18 with top 76 of sidewall 62 passing beneath ledge 77 protruding from medial portion 18 while simultaneously locking groove 67 slides along upper surface 15a of pocket 29. When jaw assembly 50 is fully engaged within pocket 29 with sidewall 62 adjacent upright surface 36 of pocket 29 and locking lip 75 of locking groove 67 engaged under protruding lip 72 at external surfaces 21, 22 of walls 13, 14, snap tab 32 snaps into position against ledge surface 78 formed into bottom 79 with an end 37 of snap tab 32 engaged against locking abutment 69. Locking lip 75, snap tab 32 and ledge 77 of meter socket block 10 thus cooperate with locking groove 67, locking abutment 69 and top 76 of jaw assembly 50 to positively retain jaw assembly 50 into pockets 29 of meter socket block 10. Upon fully registering jaw assemblies 50 into pockets 29 of meter socket block 10, cap grooves 59 of jaw assemblies 50 align with cap ledges 41 formed into meter socket block 10. Also, upon full register of jaw assemblies 50 into pockets 29, lay-in conductor channels 58 of jaw assemblies 50 are in direct alignment with phase conductor channels 17 in meter socket block 10 with conductor channels 58 extending slightly above semicircular cuts 49 and inwardly beyond parallel walls 80 of phase conductor channels 17.

Depending upon which meter seal is to be utilized within enclosure 100, the orientation of meter socket block 10 is determined. For instance, in FIG. 3, since legs 19 are aligned with depressions 102 in enclosure 100, a ring less style meter seal is indicated as legs 19 will lower meter socket block 10 into depressions 102 while shorter legs 20 will rest upon bosses 101. When meter socket block 10 has legs 19, 20 properly placed, a mounting screw 117 is inserted through central hole 25 in meter socket block 10 and screwed into mounting hole 105 in back wall 111 of enclosure 100 securing meter socket block 10 to enclosure 100. It should be readily apparent that phase conductor channels 17 in meter socket block 10 are directly in line with conduit openings 118 in top wall 113 and bottom wall 114 and thus load and line phase conductors may be laid straight in line with phase conductor channels 17 and fully engaged with lay-in conductor channels 58 of jaw assemblies 50 whereupon another major objective of this invention is fully accomplished.

Likewise if legs 19 are aligned with bosses 101 in enclosure 100, a ring style meter seal will be utilized as legs 19 will raise meter socket block 10 by resting upon bosses 101 while shorter legs 20 will be aligned over depressions 102, but spaced thereabove. Meter socket block 10 has mounting screw 117 inserted through central hole 25 and screwed into mounting hole 105 in back wall 111 of enclosure 100 securing meter socket block 10 in the raised position to enclosure 100. Phase conductor channels 17 in meter socket block 10 and lay-in conductor channels 58 in jaw assemblies 50 are still directly in line with conduit openings 118 in top wall 113 and bottom wall 114 even though meter socket block 10 has been reoriented because meter socket block 10 has been rotated 180 degrees. Since meter socket block 10 presents the same face in either orientation another major objective of this invention is achieved.

Figure 4:
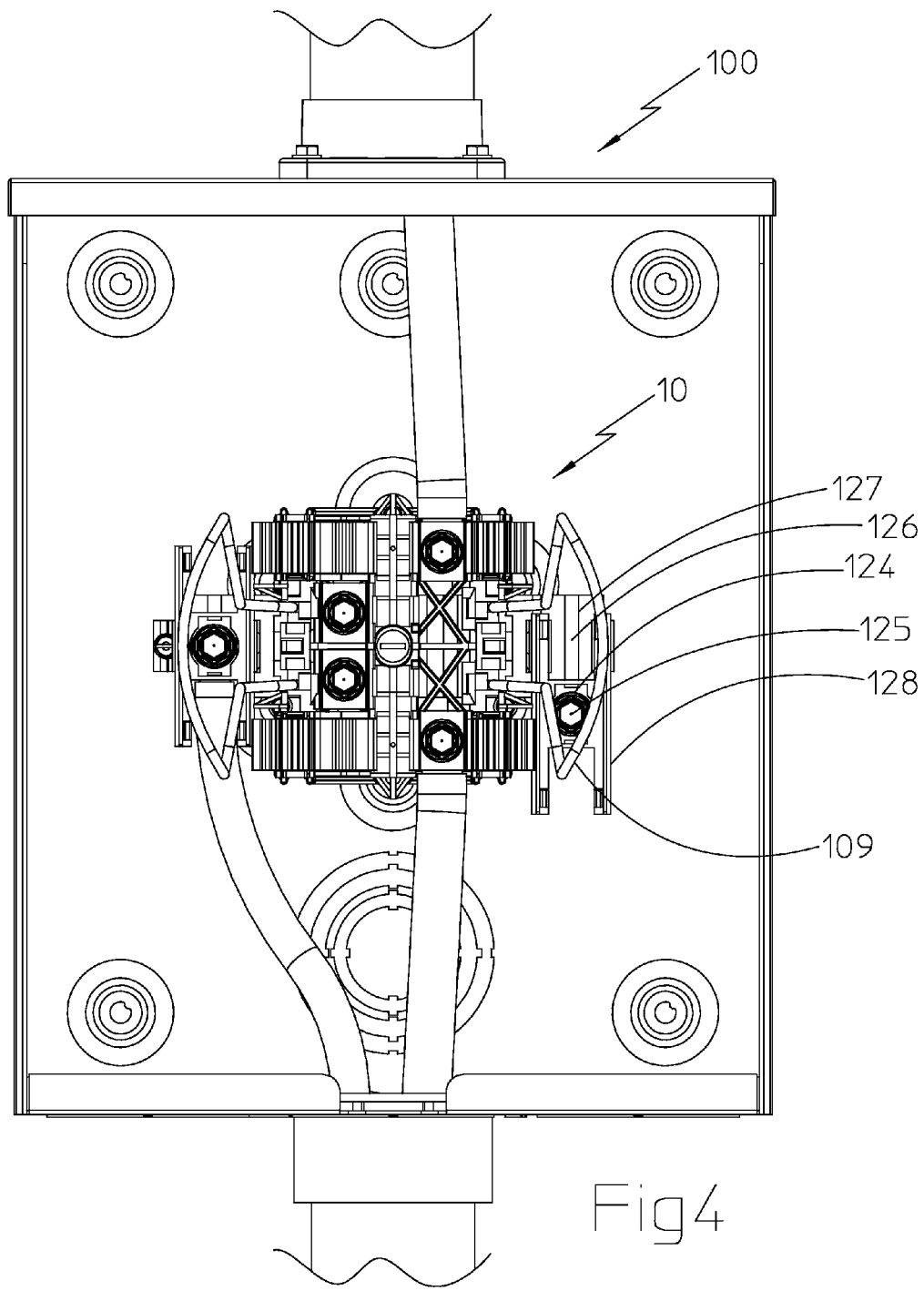
FIG. 4 is a top plan view of the meter socket block assembly shown in a typical vertical orientation with a conductor laid in one phase conductor channel and one neutral conductor laid in one neutral lug channel with lug caps overlying the ends of the conductors and secured thereto, and caps for the other phase conductor channel retained in a cap groove disposed into a top surface of the meter socket block while the other neutral conductor channel has a cap thereof retained in a cap groove in a clip-on cap carrier.

Referring back to FIG. 4, since meter socket block 10 can be oriented in two different positions while still presenting lay-in conductor channels 58 directly in line with conduit openings 118 in enclosure 100 by eliminating the two different risers commonly used to provide for different type meter seals, it should be readily apparent that enclosure 100 may be shorter in height 120 as it is no longer necessary to bend the stiffer phase conductors 45 degrees either way to attach to conductor lugs. Accordingly, another major object of this invention is fully met. Furthermore, as neutral lay-in conductor channels 126 of neutral buss assembly 123 are arranged alongside meter socket block 10, a distance from line conduit opening 118 to neutral lay-in conductor channels 126 is greater than a distance previously provided to any conductor connection in enclosures 100. Therefore, since neutral lay-in conductor channels 126 are alongside meter socket block 10, a savings in material is accomplished by reducing height 120 of enclosure 100 by at least one inch and another major aim of this invention is provided.

Figure 8:
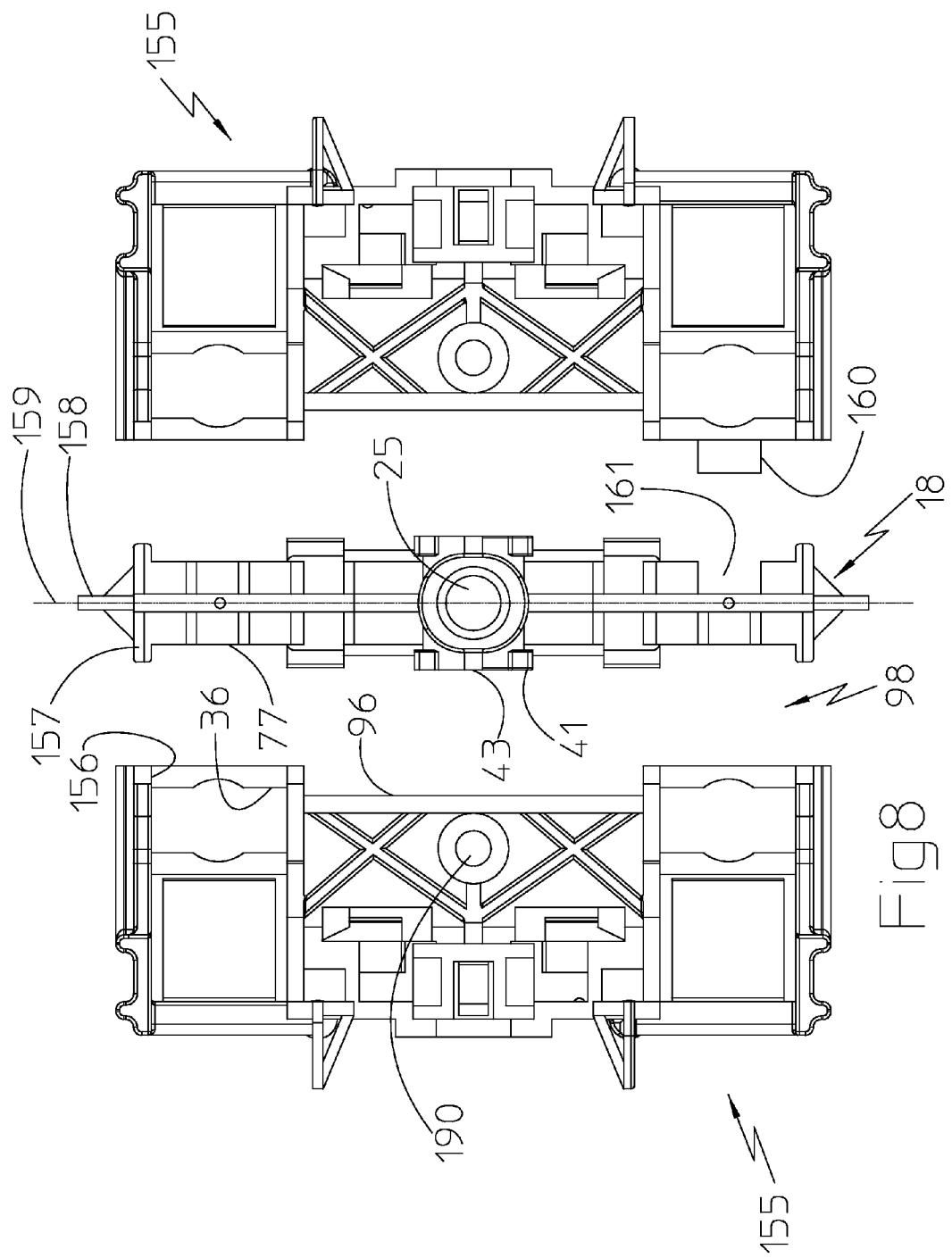
FIG. 8 is top plan view of an alternate meter block of this invention.

Meter socket block 10 may be constructed of multiple pieces yet retain the features of this invention as is shown in FIG. 8. Identical halves 155 may be joined to a separate medial portion 18, medial portion 18 capturing portions 96 of side 98 under cap stops 43 and cap groove ledges 41 wherein top surface 76 of wall 62 of base 51 of jaw assembly 50 is captured under ledge 77 of pocket 29 when base 51 is inserted into pocket 29. Identical halves 155 may further be provided with columns 156 which are captured under ledges 157 of ends 158 of medial portion 18. Identical halves 155 are thus captured by medial portion 18 when medial portion 18 is affixed into enclosure 100 by passing mounting screw 117 through screw mounting hole 25 in medial portion 18. Making of identical halves 155 may reduce mold cost outlays and/or provide for wider separation of identical halves 155 by providing a wider medial portion 18. Alternately, meter socket block 10 may be made of two identical halves 155 by dividing medial portion 18 along a center line 159 and making tongues 160 extending from identical halves and groove 161 portions disposed into medial portion 18. A fastening system located on centerline 159 may comprise a dovetail 188 and mating dovetail slot 189 provided thereupon wherein dovetail 188 of one identical half is to be mated to mating dovetail slot 189 of another half. Other features of meter socket block 10 remain with each half such that jaw assemblies 50 may readily be inserted therein and neutral buss bar assembly 123 captured thereunder if so desired. By constructing two identical halves 155 as described, individual mounting holes 190 may be provided for such that identical halves 155 may be separately mounted in a conventional meter enclosure such as on a bridge or the prior art enclosure described in U.S. Pat. No. 7,785,137 B2.

Another object of this invention is achieved as numerous parts have been eliminated from the enclosure assembly. For instance, no risers are needed and no screws to mount the risers and no screws are needed to mount the meter socket block 10 to the risers thus eliminating at least ten parts. Similarly, no screws are needed to mount jaw assemblies 50 to the meter socket block 10 thus eliminating at least four more screws.

While the present invention has been described with reference to the above described preferred embodiments and alternate embodiments, it should be noted that various other embodiments and modifications may be made without departing from the spirit of the invention. Therefore, the embodiments described herein and the drawings appended hereto are merely illustrative of the features of the invention and should not be construed to be the only variants thereof nor limited thereto.

We claim:

1. A connector assembly comprises a base, a conventional lay in conductor connector channel, a blade contact superstructure and a blade contact, said base provided with said blade contact superstructure appended to one sidewall thereof, said blade contact superstructure further comprising generally "V" shaped blade receiving supports, said blade receiving supports defining a cavity therebetween, said blade contact comprising a plated copper strip, said blade contact disposed in said cavity, said blade contact comprising an interface with an electrical blade inserted therein and said superstructure.

2. A connector assembly as in claim 1 further comprises a reinforcing spring.

3. A connector assembly as in claim 2 wherein said reinforcing spring comprises a generally "U" shaped cage having terminal ends, generally straight sides and a base wherein said straight sides extend upwardly from said base, said straight sides provided with upper ledges at engaging ends of inwardly formed upper ends and lower ledges on said straight sides adjacent said base.

4. A connector assembly as in claim 3 wherein said upper ledges of said reinforcing spring are engaged under upper ledges of said blade receiving supports.

5. A connector assembly as in claim 4 wherein said reinforcing spring is captured upon said blade receiving supports of said superstructure by said lower ledges standing on lower ledges of said blade receiving supports and said upper ledges of said reinforcing spring snapping under upper ledges provided along an external surface of said blade receiving supports.

6. A connector assembly as in claim 5 wherein said reinforcing spring contains said blade contact in said cavity.

7. A connector assembly as in claim 6 wherein one said terminal end is provided with a blade stop.

8. A connector assembly as in claim 1 wherein said plated copper strip is bent into a shape complementary with said cavity.

9. A connector assembly as in claim 2 wherein said reinforcing spring comprises a bent wire loop having straight free ends, a curved portion adjacent one free end, a straight leg adjacent to and at an angle relative to an opposite free end and a horizontal leg joining said straight leg to another straight leg pending from said curved portion.

10. A connector assembly comprises a base, a conventional conductor connector, a blade contact superstructure and a blade contact, said base provided with said blade contact superstructure appended to one sidewall thereof, said blade contact superstructure further comprising generally "V" shaped blade receiving supports, said blade receiving supports defining a cavity therebetween, said blade contact comprising a plated copper strip, said blade contact disposed in said cavity wherein said blade contact comprises an interface with an electrical blade inserted therein and said superstructure.

11. A connector assembly as in claim 10 further comprises a reinforcing spring wherein said reinforcing spring captures ends of said blade contact to retain said blade contact laterally within said cavity of said blade receiving supports.

12. A connector assembly as in claim 11 wherein at least one end of said reinforcing spring is provided with a blade stop.

13. A connector assembly as in claim 12 wherein said blade contact is bent into a shape complementary with said cavity.

14. A connector assembly comprises a base, a conventional lay-in conductor channel, a conventional conductor cap and a conductor cap carrier, said conductor cap carrier comprising a pair of parallel rails, said parallel rails joined together by a cap retainer, said parallel rails terminating in inwardly facing projections at least one end thereof, wherein said conventional lay-in conductor channel is a generally "U" shaped channel and wherein opposed sidewalls of said "U" shaped lay-in conductor channel are provided with cap grooves disposed into internal surfaces thereof wherein said cap grooves are disposed adjacent a top surface of said sidewalls.

15. A connector assembly as in claim 14 wherein a conductor cap for retaining a conductor in said conductor channel is provided with parallel grooved edges complementary to said cap grooves in said sidewalls, said conductor cap provided with a screw hole therethrough, said screw hole receiving a conductor securing screw therein.

16. A connector assembly as in claim 15 wherein said cap grooves receive said parallel grooved edges of said conductor cap slidably therein.

* * * * *